(12) United States Patent
Day

(10) Patent No.: US 11,764,781 B2
(45) Date of Patent: Sep. 19, 2023

(54) SWITCHING DEVICE

(71) Applicant: PILKINGTON GROUP LIMITED, Lathom (GB)

(72) Inventor: Stephen Roland Day, Wigan (GB)

(73) Assignee: Pilkington Group Limited, Lathom (GB)

( * ) Notice: Subject to any disclaimer, the term of this patent is extended or adjusted under 35 U.S.C. 154(b) by 334 days.

(21) Appl. No.: 16/956,657

(22) PCT Filed: Dec. 21, 2018

(86) PCT No.: PCT/GB2018/053736
§ 371 (c)(1),
(2) Date: Jun. 22, 2020

(87) PCT Pub. No.: WO2019/122913
PCT Pub. Date: Jun. 27, 2019

(65) Prior Publication Data
US 2020/0412365 A1 Dec. 31, 2020

(30) Foreign Application Priority Data
Dec. 22, 2017 (GB) ...................... 1721722

(51) Int. Cl.
*H03K 17/945* (2006.01)
*E05F 15/75* (2015.01)
(Continued)

(52) U.S. Cl.
CPC ..... *H03K 17/945* (2013.01); *B32B 17/10036* (2013.01); *B32B 17/10165* (2013.01);
(Continued)

(58) Field of Classification Search
CPC ......... H03K 17/945; H03K 2017/9455; H03K 17/97; H03K 17/975; H03K 17/968;
(Continued)

(56) References Cited

U.S. PATENT DOCUMENTS 4,233,593 A 11/1980 Bigelow
5,920,131 A 7/1999 Platt et al.
(Continued)

FOREIGN PATENT DOCUMENTS

CN 103101437 A 5/2013
DE 102004013947 B3 12/2005
(Continued)

OTHER PUBLICATIONS

U.K. Intellecutal Property Office; GB Search Report, issued in GB Application No. 1721722.5; dated Jun. 18, 2018; 2 pages; U.K. Intellectual Property Office, Newport, South Wales, U.K.
(Continued)

*Primary Examiner* — Lheiren Mae A Caroc
(74) *Attorney, Agent, or Firm* — Marshall & Melhorn, LLC

(57) ABSTRACT

A switching device includes at least one (a first) sheet of glazing material having a first major surface and an opposing second major surface, a switch attached to the first major surface of the first sheet of glazing material, and a sensor assembly facing the second major surface of the first sheet of glazing material. The switch includes a movable portion operatively coupled with the sensor assembly such that upon operation of the switch, the movable portion moves from a first position to a second position and the movement of the movable portion from the first position to the second position is detectable by the sensor assembly. The switching device may be part of a window or door for a building or a vehicle.

19 Claims, 11 Drawing Sheets

(51) Int. Cl.
  *B32B 17/10* (2006.01)
  *H01H 13/04* (2006.01)
  *H01H 13/14* (2006.01)
  *E05F 15/73* (2015.01)
  *E06B 3/02* (2006.01)

(52) U.S. Cl.
  CPC .. *B32B 17/10761* (2013.01); *B32B 17/10779* (2013.01); *B32B 17/10788* (2013.01); *E05F 15/75* (2015.01); *H01H 13/04* (2013.01); *H01H 13/14* (2013.01); *B32B 2419/00* (2013.01); *B32B 2605/006* (2013.01); *E05F 2015/763* (2015.01); *E05Y 2400/854* (2013.01); *E05Y 2400/86* (2013.01); *E05Y 2900/132* (2013.01); *E05Y 2900/531* (2013.01); *E05Y 2900/534* (2013.01); *E05Y 2900/536* (2013.01); *E05Y 2900/548* (2013.01); *E05Y 2900/55* (2013.01); *E06B 3/02* (2013.01); *H03K 2017/9455* (2013.01)

(58) Field of Classification Search
  CPC ........ B32B 17/10036; B32B 17/10165; B32B 17/10761; B32B 17/10779; B32B 17/10788; B32B 2419/00; B32B 2605/006; B32B 17/10; E05F 15/75; E05F 2015/763; E05F 15/73; H01H 13/04; H01H 13/14; E05Y 2400/854; E05Y 2400/86; E05Y 2900/132; E05Y 2900/531; E05Y 2900/534; E05Y 2900/536; E05Y 2900/548; E05Y 2900/55; E06B 3/02; E06B 3/66
  See application file for complete search history.

(56) References Cited

U.S. PATENT DOCUMENTS

| | | | |
|---|---|---|---|
| 6,031,465 | A | 2/2000 | Burgess |
| 6,294,906 | B1 | 9/2001 | Kuechler |
| 6,498,326 | B1 | 12/2002 | Knappe |
| 6,617,975 | B1 | 9/2003 | Burgess |
| 8,924,076 | B2 | 12/2014 | Boote et al. |
| 10,447,262 | B2 * | 10/2019 | Bach ...................... H03K 17/97 |

FOREIGN PATENT DOCUMENTS

| | | |
|---|---|---|
| EP | 1045300 A2 | 10/2000 |
| GB | 2153078 A | 8/1985 |
| GB | 2157078 A | 10/1985 |
| JP | S59104430 U | 7/1984 |
| JP | 2010521353 A | 6/2010 |
| JP | 2017162749 A | 9/2017 |
| WO | WO/0213387 A1 | 2/2002 |
| WO | WO/2008113978 A1 | 9/2008 |

OTHER PUBLICATIONS

European Patent Office; International Search Report with Written Opinion, issued in PCT/GB2018/053736; dated Mar. 12, 2019; 11 pages, European Patent Office, Rijswijk, Netherlands.
Japan Patent Office, Office Action issued in Japanese Patent Application No. 2020-534263 dated Jun. 6, 2023, 2 pages.

* cited by examiner

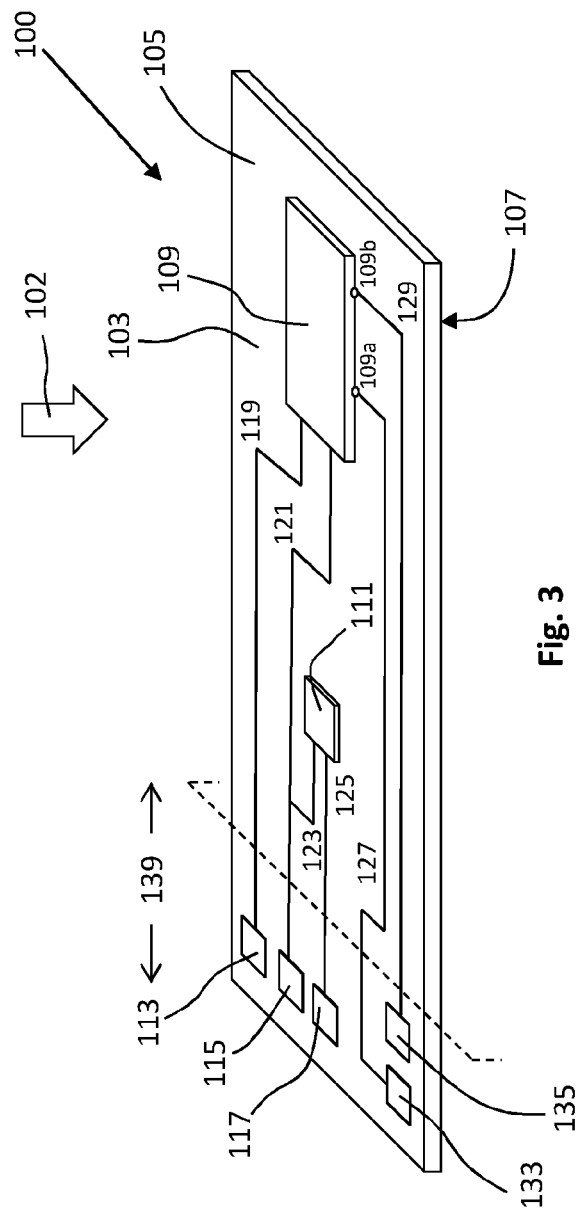
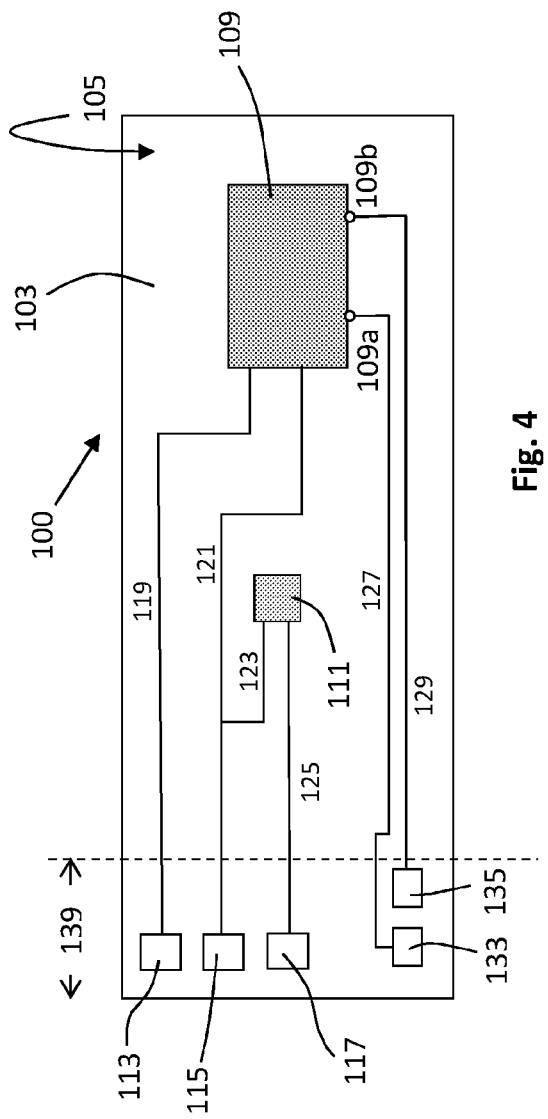
Fig. 3
Fig. 4

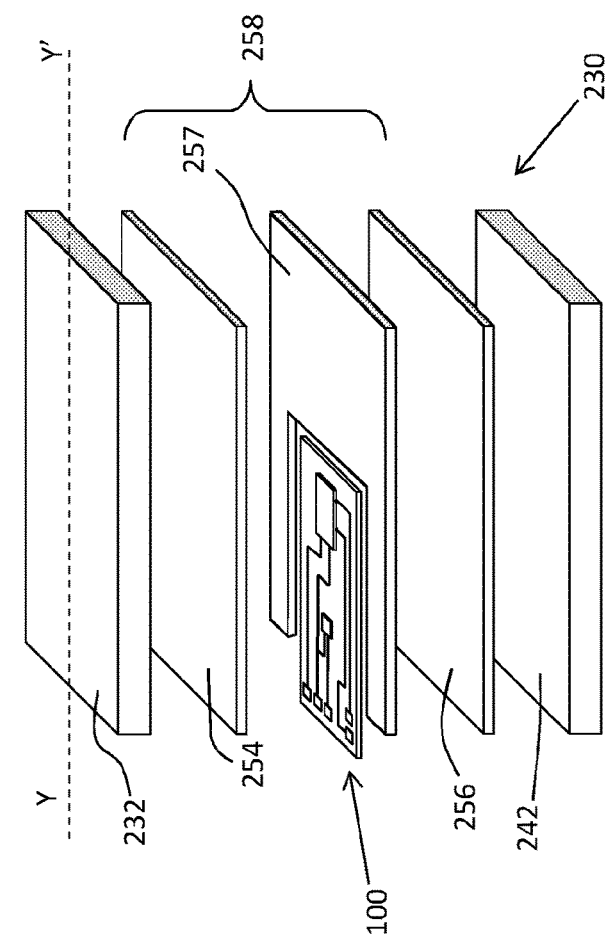
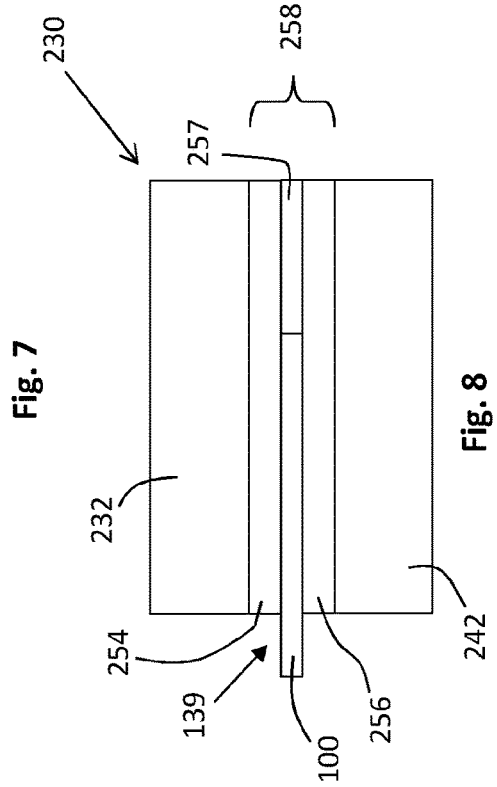
Fig. 7
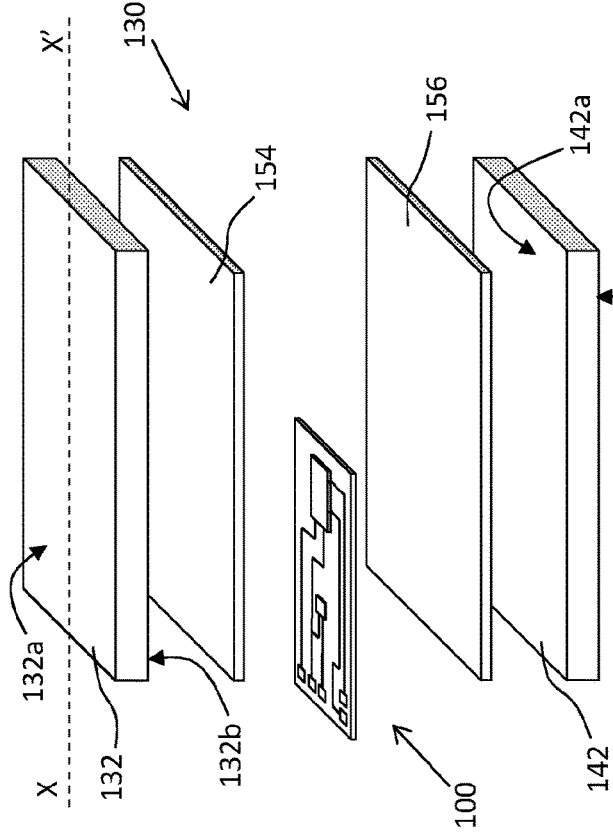
Fig. 5
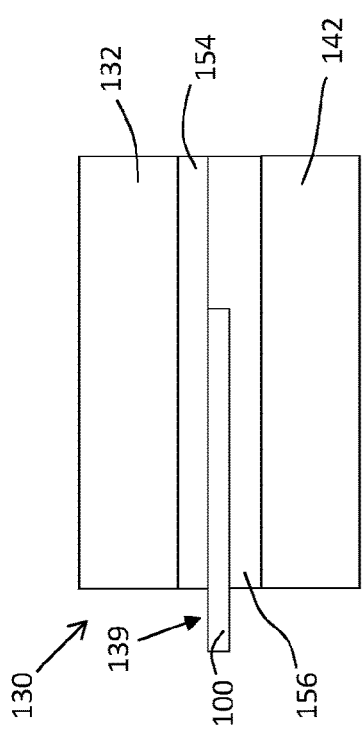
Fig. 8
Fig. 6

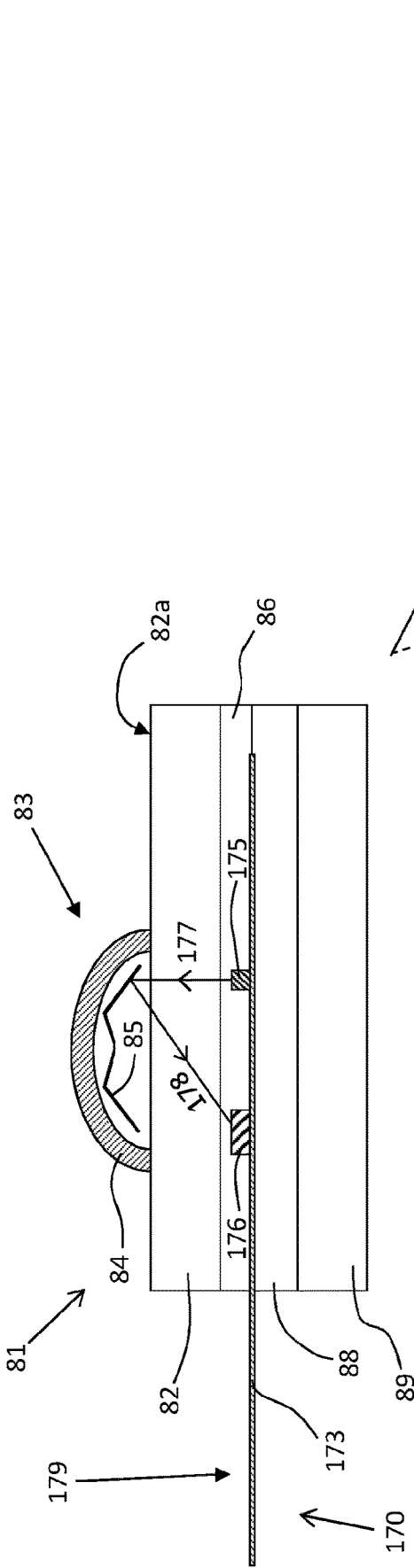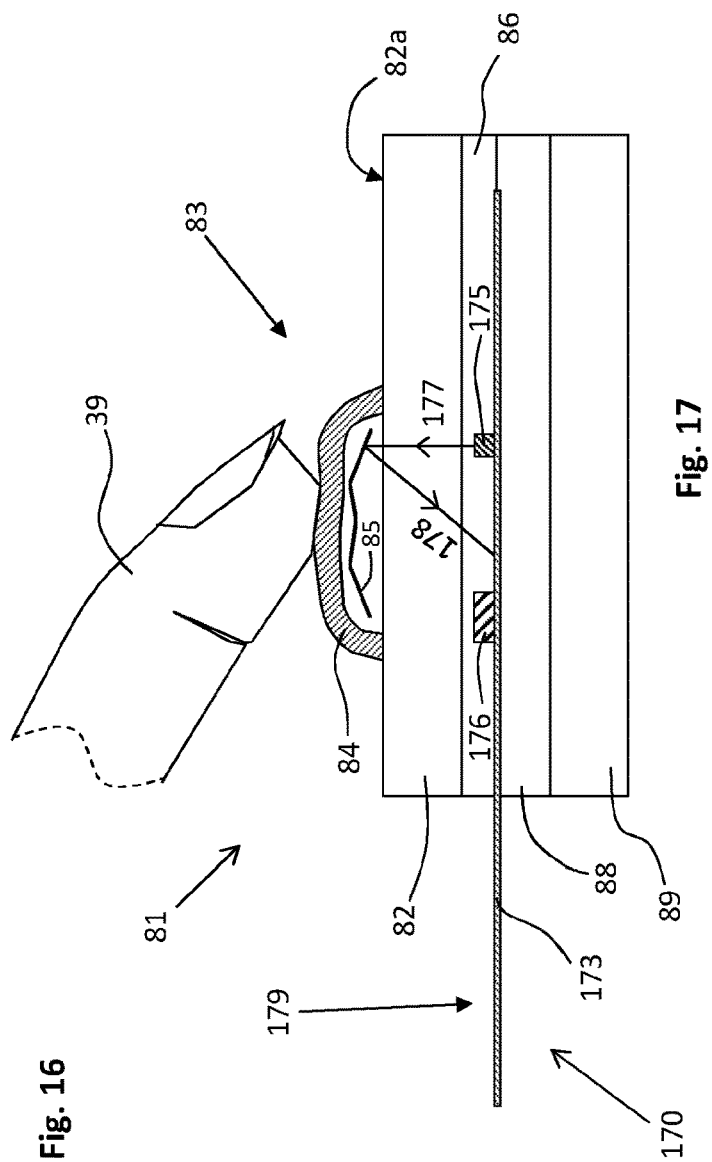

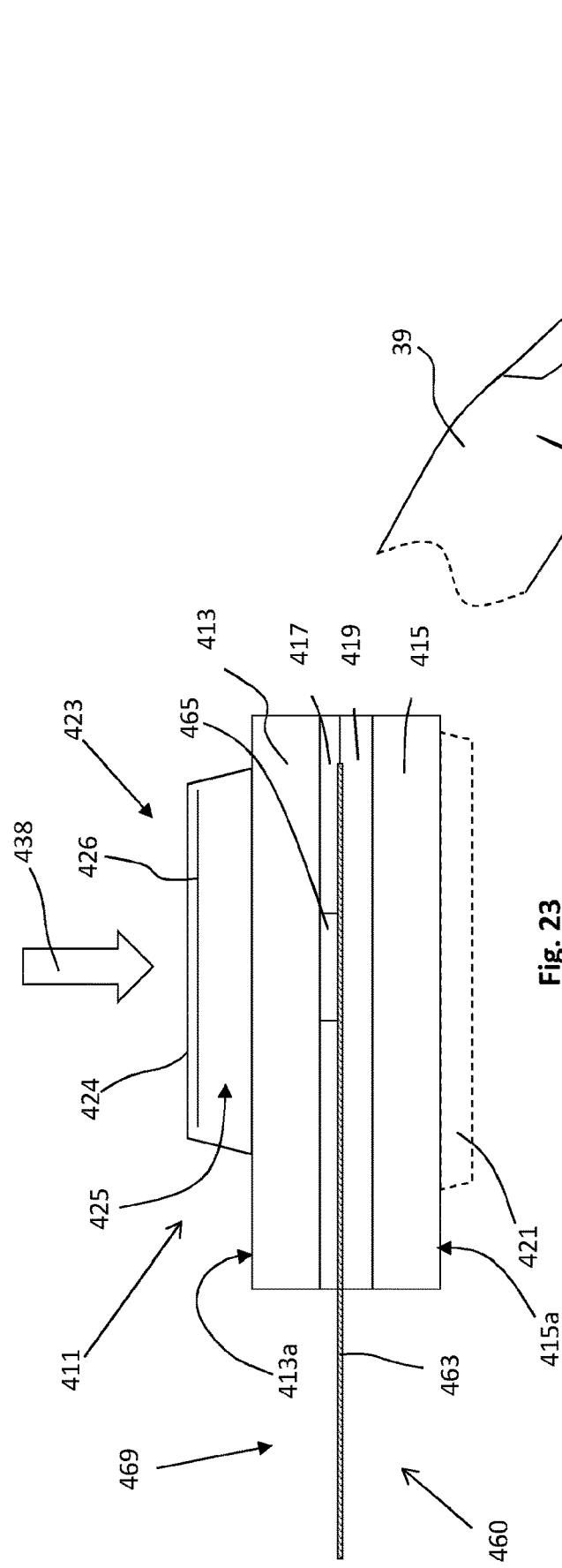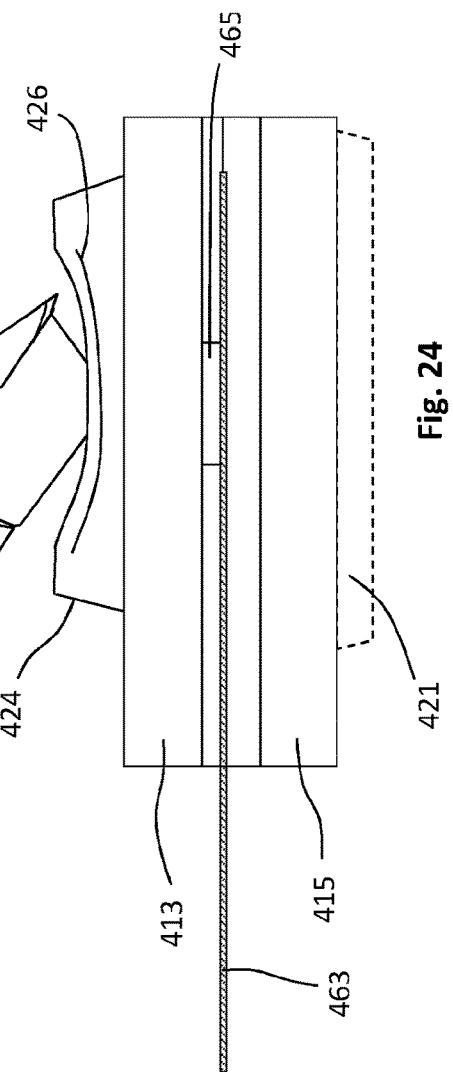

SWITCHING DEVICE

BACKGROUND OF THE INVENTION

The present invention relates to switching device comprising a sheet of glazing material, the switching device being usable to actuate an electrically operable device in communication with the switching device.

It is well known to use a switch to cause electrical current to flow to an electrically operated device thereby actuating the electrically operated device.

In many applications, the switch is located remotely from the electrically operated device to be actuated, for example a room light is typically switched on or off by means of a switch located on a wall.

In other applications the switch may be integral with the electrically operated device, for example an "on/off" push button type switch on a television or mobile phone, where the switch is typically located in the housing surrounding the screen.

For certain applications it is difficult to integrate the switch with the electrically operated device. For example, in door applications comprising an electrically operable mechanism to open/close or lock/unlock the door, whilst it is usual to incorporate a switch in the door frame it is often desirable to locate the switch on the door leaf itself. Whilst this may be acceptable for certain types of door leaf, in the case of a glass door leaf it is difficult to integrate the switch with the glass sheet forming the door leaf. One known solution is to provide the glass door leaf with a suitably sized hole (usually by drilling) and to incorporate a suitable switch into the hole. Such a solution however may weaken the door leaf, and in applications requiring thermally toughened glass, the hole must be drilled before glass sheet is thermally toughened. The situation is similar for a window comprising a pane of glazing material where it may be desirable in certain situations to locate a switch on the pane of glazing material.

A control for use upon a solid panel, devoid of control shaft apertures is described in U.S. Pat. No. 4,233,593.

A switch/display unit is described in GB2157078A.

Control arrangements for electrical cookers are described in U.S. Pat. Nos. 5,920,131, 6,498,326B1 and DE102004013947B3. A control element for switching and controlling an electrical appliance having a cover panel is described in U.S. Pat. No. 6,294,906B1.

It is also known to use remotely activated wireless switches. Such switches are known in the automotive field and are used in vehicles to remotely open the boot lid.

Usually the vehicle key fob includes suitable circuitry to transmit a signal wirelessly to a sensor in the vehicle, the sensor then causing the boot lid release mechanism to actuate.

There are however certain situations when such a system is difficult to operate, for example the key fob still needs to be actuated.

As more vehicles are moving towards keyless entry, where it is known to unlock a vehicle door upon detecting the presence of a key fob on a user, the accessibility of the key fob becomes even more of a problem because no actual key needs to be physically inserted into the ignition system of the vehicle in order to drive the vehicle. In such systems, whilst the doors and/or boot lid mechanisms are unlocked by detecting the presence of the key fob on the user, manual operation of a switch (door handle, boot release mechanism) is typically required to gain access to the vehicle and the position of such switches is largely determined by the design of the vehicle bodywork.

A keyless entry system for vehicles is described in U.S. Pat. No. 6,617,975B1.

It is known to use capacitive switches incorporated into a laminated glazing, for example as described in WO2008/113978A1. Capacitive switches may be affected by rain drops on the exterior surface of the vehicle window, and/or the vehicle user may be wearing gloves, making it difficult to manually operate this type of switch.

The present invention aims to at least partially overcome the aforementioned problems.

SUMMARY OF THE INVENTION

Accordingly the present invention provides from a first aspect a switching device comprising at least one (a first) sheet of glazing material having a first major surface and an opposing second major surface, a switch attached to the first major surface of the first sheet of glazing material, and a sensor assembly facing the second major surface of the first sheet of glazing material, wherein the switch comprises a movable portion operatively coupled with the sensor assembly such that upon operation of the switch, the movable portion moves from a first position to a second position and the movement of the movable portion from the first position to the second position is detectable by the sensor assembly.

By coupling the movement of the movable portion of the switch with the sensor assembly it is possible to position the switch on one side of the sheet of glazing material and the sensor assembly on the opposite side. This avoids the need to use holes or bores (i.e. through bores or blind bores) in the sheet of glazing material which may weaken the sheet of glazing material. Furthermore, by attaching the switch to the first major surface of the first sheet of glazing material the switch is positioned to be readily visible to a person and may be more conveniently located for easier operation thereof. Movement of the movable portion from the first position to the second position creates a perturbation in the coupling between the movable portion and the sensor assembly that may be remotely sensed through the first sheet of glazing material by the sensor assembly.

The present invention may be carried out in different embodiments with the switch attached to one side of the sheet of glazing material and the sensor assembly on opposite side of the sheet of glazing material i.e. the switch is spaced apart from the sensor assembly by at least the sheet of glazing material.

In some embodiments the sensor assembly comprises a sensor and a substrate, the substrate having a first major surface and a second opposing major surface, wherein the sensor is configured to detect the movement of the movable portion from the first position to the second position.

Preferably the sensor is mounted on the first or second major surface of the substrate.

Preferably the first major surface of the substrate faces the second major surface of the first sheet of glazing material.

Preferably the sensor is mounted on the first major surface of the substrate and the first major surface of the substrate faces the second major surface of the first sheet of glazing material.

Preferably the sensor is mounted on the second major surface of the substrate and the first major surface of the substrate faces the second major surface of the first sheet of glazing material.

Preferably the substrate is optically transparent.

Preferably the substrate does not impede the detection of the movable portion from the first position to the second position by the sensor and/or the sensor assembly.

Preferably the substrate has an opening therein and the sensor is positioned in the opening in the substrate.

Preferably the substrate comprises polyethylene terephthalate (PET) or a glass sheet, preferably a soda-lime-silica glass sheet.

Preferably the sensor assembly comprises at least one electrically conductive pathway on the first and/or second major surface of the substrate, the at least one electrically conductive pathway being in electrical communication with the sensor.

Preferably at least one of the electrically conductive pathways on the first and/or second major surface of the substrate comprises an electrically conductive coating, in particular a printed ink or a transparent electrically conductive coating, such as ITO or a layer of fluorine doped tin oxide.

Preferably the substrate is attached to the first sheet of glazing material by at least one adhesive layer. It is preferred that the at least one adhesive layer used to attach the substrate to the first sheet of glazing material does not impede the ability of the sensor and/or the sensor assembly to detect the movement of the movable portion from the first position to the second position.

Preferably the sensor comprises a sensing portion and the sensing portion faces the second major surface of the first sheet of glazing material.

In some embodiments the sensor assembly comprises a sensor mounted on the second major surface of the first sheet of glazing material, the sensor being configured to detect the movement of the movable portion from the first position to the second position.

Preferably the sensor assembly comprises at least one electrically conductive pathway on the second major surface of the first sheet of glazing material, the at least one electrically conductive pathway on the second major surface of the first sheet of glazing material preferably being in electrical communication with the sensor mounted on the second major surface of the first sheet of glazing material.

Preferably at least one of the electrically conductive pathways on the second major surface of the first sheet of glazing material comprises an electrically conductive coating, in particular a printed ink or a transparent electrically conductive coating, such as ITO or a layer of fluorine doped tin oxide.

Preferably the sensor comprises a sensing portion and the sensing portion faces the second major surface of the first sheet of glazing material.

In some embodiments the sensor assembly comprises a sensor having a sensing portion and the sensing portion faces the second major surface of the first sheet of glazing material. Signals detectable by the sensing portion pass through the first sheet of glazing material to reach the sensing portion.

In some embodiments the sensor assembly comprises a sensor mounted on the second major surface of the first sheet of glazing material, the sensor being configured to detect a perturbation in the coupling between the movable portion and the sensor assembly due to the movement of the movable portion from the first position to the second position.

In some embodiments the sensor assembly comprises a sensor and a substrate, wherein substrate has a first major surface and a second opposing major surface, the sensor having a sensing portion, wherein the sensor is mounted on the first or second major surface of the substrate, further wherein the sensing portion faces the first or second major surface of the substrate and the first or second major surface of the substrate faces the second major surface of the first sheet of glazing material.

Preferably the substrate is transparent to signals detectable by the sensing portion. In these embodiments, it is preferred that the sensing portion faces the first or second major surface of the substrate such that signals detectable by the sensing portion pass through the substrate to the sensing portion.

Preferably the substrate has an opening therein and the sensing portion is arranged to face the opening in the substrate such that signals detectable by the sensing portion pass through the opening in the substrate to the sensing portion.

In some embodiments the sensor assembly comprises a sensor having a sensing portion and the sensing portion faces away from second major surface of the first sheet of glazing material.

In some embodiments the sensor assembly functions as a proximity sensor to detect the movement of the movable portion of the switch from the first position to the second position.

In some embodiments the movable portion is operatively coupled to the sensor assembly by an electric field.

Preferably the sensor assembly comprises a capacitance sensor and movement of the movable portion causes a change in capacitance that is detectable by the sensor assembly.

Preferably the movable portion of the switch comprises at least one electrically conductive plate and the sensor assembly comprises first and second electrically conductive plates, the electrically conductive plate of the movable portion being capacitively coupled with the first and second electrically conductive plates of the sensor assembly such that there is a first capacitance between at least a portion of the electrically conductive plate of the movable portion and the first electrically conductive plate of the sensor assembly and a second capacitance between at least a portion of the electrically conductive plate of the movable portion and the second electrically conductive plate of the sensor assembly, and wherein upon moving the electrically conductive plate of the movable portion from a first position relative to the first electrically conductive plate of the sensor assembly to a second position relative to the first electrically conductive plate of the sensor assembly, the first and/or second capacitance changes. The change of the first and/or second capacitance is measurable and may be used to provide a signal to indicate that the switch has been actuated. Preferably the first and second electrically conductive plates of the sensor assembly are fixed such that the spacing therebetween is constant, or substantially constant.

In some embodiments the movable portion is operatively coupled to the sensor assembly by a magnetic field.

Preferably the movable portion comprises a magnet and the sensor assembly comprises a magnetic field sensor, in particular a Hall effect sensor.

Preferably the movable portion comprises a magnetically permeable element movable from a first position to a second position and the sensor assembly comprises a magnet and a magnetic field sensor, in particular a Hall effect sensor.

Preferably the sensor assembly comprises an inductive sensor.

In some embodiments where the movable portion is operatively coupled to the sensor assembly by a magnetic field, preferably the movable portion comprises a magnetically permeable element and the sensor assembly comprises an inductive sensor.

In some embodiments where the movable portion is operatively coupled to the sensor assembly by a magnetic field, preferably the movable portion comprises an electrically conductive loop or closed-circuit coil and the sensor assembly comprises an inductive sensor.

In some embodiments where the movable portion is operatively coupled to the sensor assembly by a magnetic field, preferably the movable portion comprises at least one closed circuit coil and the sensor assembly comprises a first coil, the first coil of the sensor assembly having first and second electrical connectors such that upon moving the movable portion from the first position to the second position the inductive coupling between the at least one closed circuit coil of the movable portion and the first coil of the sensor assembly is measurable between the first and second electrical contacts of the first coil of the sensor assembly.

In some embodiments where the movable portion is operatively coupled to the sensor assembly by a magnetic field, preferably the movable portion comprises at least one closed circuit coil and the sensor assembly comprises first and second coils, the first coil of the sensor assembly having first and second electrical connectors and the second coil of the sensor assembly being in electrical communication with an alternating current power supply for producing an alternating magnetic field in the second coil of the sensor assembly, wherein upon moving the movable portion from the first position to the second position the inductive coupling between the at least one closed circuit coil of the movable portion, the first coil of the sensor assembly and the second coil of the sensor assembly is measurable between the first and second electrical contacts of the first coil of the sensor assembly.

In some embodiments the movable portion is operatively coupled to the sensor assembly by an acoustic signal, wherein upon moving the movable portion from the first position to the second position, the acoustic signal is produced for detection by the sensor assembly.

In some embodiments the movable portion is operatively coupled with the sensor assembly by at least one (a first) beam of electromagnetic radiation, more preferably at least one beam of light and/or at least one beam of infrared radiation. In these embodiments the beam of electromagnetic radiation is transmitted through the first sheet of glazing material towards the movable portion and moving the movable portion from the first position to the second position causes a disturbance of the beam of electromagnetic radiation reflected from at least a portion of the movable portion.

The first beam of electromagnetic radiation comprises electromagnetic radiation having at least one (a first) wavelength. Preferably the sensor assembly comprises a sensor having a sensing portion sensitive to electromagnetic radiation having at least the first wavelength.

Preferably the first beam of electromagnetic radiation comprises electromagnetic radiation having at least one wavelength in the range 300 nm to 3000 nm.

Preferably the first beam of electromagnetic radiation comprises electromagnetic radiation having at least one wavelength in the visible region i.e. 380 nm to 780 nm.

Preferably the first beam of electromagnetic radiation comprises electromagnetic radiation having at least one wavelength in the infrared region i.e. greater than 780 nm, preferably 780 nm to 3000 nm, more preferably 800 nm to 1500 nm.

Preferably the sensor assembly comprises (i) a transmitter portion for emitting the first beam of electromagnetic radiation through the first sheet of glazing material towards the movable portion, and (ii) a sensor portion for detecting electromagnetic radiation, preferably electromagnetic radiation emitted by the transmitter portion, and the movable portion comprises a portion reflective to electromagnetic radiation emitted by the transmitter portion, such that upon moving the movable portion from the first position to the second position, electromagnetic radiation from the first beam of electromagnetic radiation is reflected onto the sensor portion. Preferably upon moving the movable portion from the second position to the first position, electromagnetic radiation from the first beam of electromagnetic radiation is not reflected onto the sensor portion.

Preferably the sensor assembly comprises (i) a transmitter portion for emitting the first beam of electromagnetic radiation through the first sheet of glazing material towards the movable portion, and (ii) a sensor portion for detecting electromagnetic radiation, preferably electromagnetic radiation emitted by the transmitter portion, and the movable portion comprises a portion reflective to electromagnetic radiation emitted by the transmitter portion, the reflective portion reflecting the first beam of electromagnetic radiation onto the sensor portion, and upon moving the movable portion from the first position to the second position, electromagnetic radiation reflected off the reflective portion changes polarisation and/or amplitude and/or direction. The change of polarisation and/or amplitude and/or direction of the electromagnetic radiation reflected off the reflective portion may be used to indicate that the switch has been actuated.

Preferably the sensor assembly comprises (i) a transmitter portion for emitting the beam of electromagnetic radiation towards the movable portion and a sensor portion for detecting electromagnetic radiation, preferably electromagnetic radiation emitted by the transmitter portion, the first beam of electromagnetic radiation internally reflecting off a first portion of the first major surface of the first sheet of glazing material onto to the sensor portion, and the movable portion comprises a contact portion for contacting the first portion of the first major surface of the first sheet of glazing material, such that upon moving the movable portion from the first position to the second position, the contact portion of the movable portion contacts at least the first portion of the first major surface of the first sheet of glazing material so that electromagnetic radiation from the first beam of electromagnetic radiation is prevented from reaching the sensor portion.

In embodiments when the sensor assembly comprises a transmitter portion, preferably the transmitter portion comprises a light emitting diode and/or an infrared emitting diode.

In embodiments when the sensor assembly comprises a sensor having a sensing portion, preferably the sensing portion is sensitive to visible light and/or infrared wavelengths.

In some embodiments the switching device comprises feedback means to indicate when the movable portion has moved from the first position to the second position and/or from the second position to the first position. In these embodiments the feedback means may be used to indicate that the switch has been operated.

Preferably the feedback means comprises at least one source of illumination, in particular a light emitting diode.

Preferably the feedback means faces the second major surface of the first sheet of glazing material.

In some embodiments the switching device comprises a second sheet of glazing material spaced apart from the first sheet of glazing material.

Preferably the sensor assembly is between the first and second sheets of glazing material.

The second sheet of glazing material has a first major surface and a second major surface, and the switching device may be configured such that the second major surface of the first sheet of glazing material faces the first major surface of the second sheet of glazing material. Preferably the sensor assembly faces the second major surface of the first sheet of glazing material.

Preferably the first sheet of glazing material is joined to the second sheet of glazing material by at least one sheet of adhesive interlayer material, in particular polyvinyl butyral (PVB), acoustic modified PVB, a copolymer of ethylene such as ethylene acetate, polyurethane, polycarbonate, poly vinyl chloride or a copolymer of ethylene and methacrylic acid.

Preferably the first sheet of glazing material is joined to the second sheet of glazing material by a perimeter seal such that there is at least one air space between the first and second sheets of glazing material. The sensor assembly may be located in the air space. The air space may be a low pressure air space.

Preferably the second sheet of glazing material is spaced apart from a third sheet of glazing material.

The switchable device may comprise more than three spaced apart sheets of glazing material.

In embodiments having first and second sheets of glazing material and wherein the sensor assembly comprises a sensor and a substrate, preferably the substrate is between a first sheet of adhesive interlayer material and a second sheet of adhesive interlayer material and the first and second sheets of adhesive interlayer material are between the first and second sheets of glazing material.

In embodiments having first and second sheets of glazing material and wherein the sensor assembly comprises a sensor and a substrate, preferably the substrate is between a first sheet of adhesive interlayer material and a second sheet of adhesive interlayer material, the substrate being positioned in a cut-out region in a third sheet of adhesive interlayer material, and the first, second and third sheets of adhesive interlayer material are between the first and second sheets of glazing material.

Other embodiments have other preferable features.

Preferably the movable portion of the switch is caused to move between the first position and the second position by a manually generated force.

Preferably the movable portion of the switch is caused to move between the first position and the second position by a manually generated force parallel to or perpendicular to the first major surface of the first sheet of glazing material.

Preferably the movable portion of the switch is slidable relative to the first major surface.

Preferably the movable portion of the switch is a depressible portion.

Preferably the switch comprises a resilient portion, the resilient portion being at least part of the movable portion of the switch.

Preferably the switch comprises a spring biased switch to bias the movable portion in the first or second position.

Preferably the switch comprises a body portion and the body portion is attached to the first major surface of the first sheet of glazing material, the movable portion being movable relative to the body portion. Preferably the body portion is attached to the first major surface of the sheet of glazing material by at least one adhesive. Suitable adhesives include pressure sensitive adhesives and epoxy resins.

Preferably the switch comprises a housing and the housing is attached to the first major surface of the first sheet of glazing material, the movable portion being movable relative to the housing. Preferably the housing is attached to the first major surface of the sheet of glazing material by at least one adhesive. Suitable adhesives include pressure sensitive adhesives and epoxy resins.

Preferably the switch comprises at least one foot, the at least one foot being attached to the first major surface of the first sheet of glazing material, the movable portion being movable relative to the at least one foot. Preferably the at least one foot is attached to the first major surface of the sheet of glazing material by at least one adhesive. Suitable adhesives include pressure sensitive adhesives and epoxy resins.

Preferably the switch is attached to the first major surface of the sheet of glazing material by at least one adhesive. Suitable adhesives include pressure sensitive adhesives and epoxy resins.

Preferably the switching device is operatively coupled with an electrically operable device.

Preferably the switching device is operatively coupled with an electrically operable device such that upon moving the movable portion from the first position to the second position and/or from the second position to the first position, electrical power, in particular electrical current and/or voltage, supplied to the electrically operable device is changed. Preferably upon moving the movable portion between the first and second positions, the electrically operable device changes from an energised state to an unenergized state.

Electrical power may be supplied to the electrically operable device by a direct current electrical power supply and/or an alternating current electrical power supply.

Preferably the switching device is operatively coupled with an electrical power supply.

Preferably the switching device is part or a window or door. The window or door may be part of a building or vehicle.

When the switching device is part of a window or door of a vehicle, the vehicle having an interior, preferably the first major surface of the first sheet of glazing material faces away from the interior of the vehicle. In such embodiments, the switch may be referred to as being on "surface one" of the window (using conventional naming nomenclature).

When the switching device is part of a window or door of a building, the building having an interior, preferably the first major surface of the first sheet of glazing material faces away from the interior of the vehicle. In such embodiments, the switch may be referred to as being on "surface one" of the window (again, using conventional naming nomenclature).

In some embodiments the switching device is part of a window or door of a vehicle and the switching device is operatively coupled with an electrically operable device, the electrically operable device at least in part controlling the operational state of one or more of a vehicle window, a vehicle door, a vehicle rear window, a vehicle bonnet, a vehicle boot lid and a vehicle fuel filler cap. For example, the electrically operable device may be used to open or close the vehicle fuel filler cap.

BRIEF DESCRIPTION OF THE DRAWINGS

The invention will now be described with reference to the following figures (not to scale) in which.

FIG. 3 shows a schematic isometric representation of a sensor assembly for a switchable device according to the present invention;

FIG. 4 shows a plan view of the sensor assembly shown in FIG. 3;

FIG. 5 shows a schematic exploded isometric representation of a laminated glazing incorporating the sensor assembly shown in FIGS. 3 and 4;

FIG. 6 shows a schematic cross-section view of the laminated glazing shown in FIG. 5 through the line X-X';

FIG. 7 shows a schematic exploded isometric representation of another laminated glazing incorporating the sensor assembly shown in FIGS. 3 and 4;

FIG. 8 shows a schematic cross-section view of the laminated glazing shown in FIG. 7 through the line Y-Y';

FIG. 16 shows a schematic cross-sectional representation of another switchable device in accordance with the present invention, the switchable device being in a first configuration;

FIG. 17 shows a schematic cross-sectional representation of the switchable device of FIG. 16 in a second configuration;

FIG. 23 shows a schematic cross-sectional representation of another switchable device in accordance with the present invention, the switchable device being in a first configuration;

FIG. 24 shows a schematic cross-sectional representation of the switchable device of FIG. 23 in a second configuration;

DETAILED DESCRIPTION OF THE INVENTION

Figure 1:
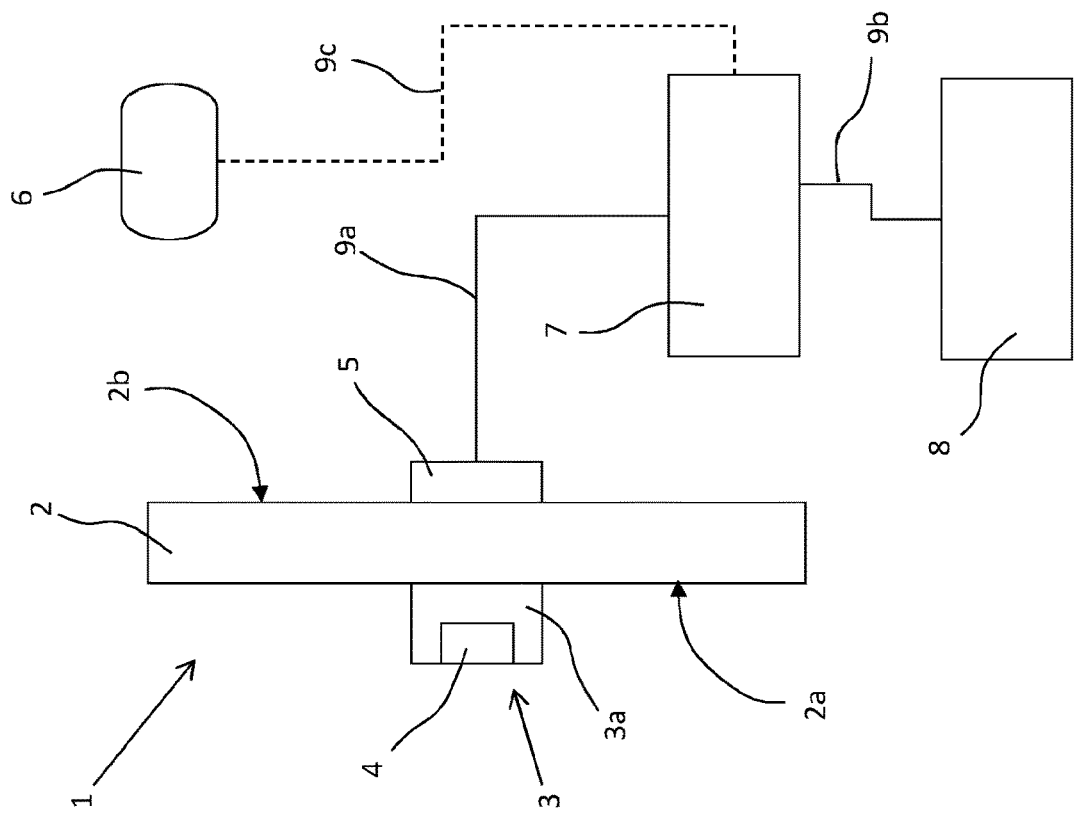
FIG. 1 shows a schematic representation of a switchable device according to the present invention.

FIG. 1 shows a schematic switching device according to the present invention to describe the general operation thereof. The switching device 1 comprises a sheet of glazing material 2 such as glass. A suitable glass composition is soda-lime-silica glass. The glass may be annealed, thermally toughened, semi-toughened or chemically strengthened.

A typical soda-lime-silica glass composition is (by weight), $SiO_2$ 69-74%; $Al_2O_3$ 0-3%; $Na_2O$ 10-16%; $K_2O$ 0-5%; MgO 0-6%; CaO 5-14%; $SO_3$ 0-2%; $Fe_2O_3$ 0.005-2%. The glass composition may also contain other additives, for example, refining aids, which would normally be present in an amount of up to 2%.

The sheet of glazing material 2 has a first major surface 2a and a second opposing major surface 2b. Attached to the first major surface 2a is a switch 3 comprising a body portion 3a and a movable portion 4. The movable portion 4 is movable relative to the body portion 3a. The body portion 3a may be a housing. The switch 3 is attached to the first major surface 2a by means of a suitable adhesive (not shown). In this example there is a layer of adhesive between the body portion 3a and the first major surface 2a. The body portion 3a is therefore essentially static relative to the first major surface 2a.

The movable portion 4 is able to move relative to the first major surface 2a in a direction perpendicular to a normal on the first major surface 2a and/or a direction parallel to a normal on the first major surface 2a. When the sheet of glazing material is planar (i.e. flat as shown), or substantially planar, the movable portion of the switch is able to move between the first position and the second position by a manually generated force parallel to or perpendicular to the first major surface 2a of the sheet of glazing material 2.

For example, the switch 3 may be a press button type, in which case the movable portion 4 moves in a direction parallel to a normal on the first major surface 2a, or when the glazing material is flat, the movable portion 4 moves in a direction perpendicular to the first major surface 2a.

Angular movement relative to the first major surface 2a is also possible.

Alternatively, the switch 3 may be a slidable type, for example comprising a linearly slidable portion or a rotatably slidable portion, in which case the movable portion 4 moves in a direction perpendicular to a normal on the first major surface 2a i.e. in a plane parallel to the first major surface 2a. For such slidable type switches, the movable portion 4 may be located in a housing, the housing being attached to the first major surface 2a of the sheet of glazing material 2, and the movable portion is movable relative to the housing.

On the opposite side of the sheet of glazing and facing the second major surface 2b is a sensor 5. The output of the sensor 5 is in electrical communication with a controller 7 and an electrically operable device 8 by means of suitable cabling 9a, 9b. Instead of cabling 9a, 9b, wireless communication may be used. The controller 7 is also an electrically operable device.

The switch 3 is used to actuate the electrically operable device 8. The switch 3 is operated i.e. manually pressed, to cause the movable portion 4 to move relative to the first major surface 2a. The movement of the movable portion 4 is sensed by the sensor 5 which causes an output signal to be sent to the controller 7. The controller 7 is used to cause electrical power to be supplied to the electrically operable device 8 i.e. the electrically operable device 8 is switched to an "on" (or energised) state. Operating the switch 3 again causes the movable portion 4 to move relative to the first major surface 2a. This movement is sensed by the sensor 5 which causes another output signal to be sent to the controller 7 so that the controller ceases the supply of electrical power to the electrically operable device 8 i.e. the electrically operable device 8 is switched to an "off" (or unenergized) state.

In addition to moving between a first position and a second position, the movable portion 4 of the switch 3 may be movable between one or more further positions. For example, the movable portion of the switch may be movable between the first position and the second position in a single operation or in multiple discreet steps. When the movable portion of the switch is in the first position the sensor provides a first signal (which may be a null signal) and when the movable portion of the switch is in the second position the sensor provides a second signal. The switch 3 may be a proportional switch such that the position of the movable portion between the first and second positions is detectable by the sensor to provide a signal that is proportional to the difference between the first and second signals. For such a switch the amount of electrical power (voltage and/or current) provided to the electrically operable device is controllable between many different levels.

The controller 7 may also provide sufficient electrical power to actuate the electrically operable device 8, or there may be a separate power supply that provides power to the electrically operable device 8, and the controller 7 controls the flow of power from the separate power supply to the electrically operable device 8.

The controller 7 may be configured such that upon detecting a switching operation by operation of the switch 3, a feedback signal is sent to a feedback indicator 6 by means of suitable cabling 9c (or wirelessly). The feedback indicator 6 may be used to indicate the operational state of the electrically operable device 8. For example, the switch 3 may be operated firstly to switch the electrically operable device to an "on" state, and the feedback indicator 6 would be used to indicate that the switch was being pressed. Upon releasing the switch, the electrically operable device 8 would remain in the "on" state until the switch was operated again and the feedback indicator 6 no longer indicator that the switch was being pressed.

In an alternative, the feedback indicator may remain in an active state to indicate that the electrically operable device was in an "on" state until the switch was operated again.

In another alternative operation of the switch 3 causes the electrically operable device 8 to switch to an "on" state and the feedback indicator 6 becomes activated. However, when the switch is no longer operated, the operational state of the electrically operable device reverts to the "off" state and the feedback indicator is deactivated.

There are many known switching operations that may be used with a binary on/off type of switch.

For example, in embodiments where, with the movable portion 4 in a first position, no electrical power is provided to the electrically operable device 8, at least the following switching operations are possible:

(a) Electrical power is provided to the electrically operable device upon switching the movable portion from the first position to the second position. Electrical power is ceased to be provided to the electrically operable device when the movable portion is moved from the second position to the first position.

(b) Electrical power is provided to the electrically operable device upon switch the movable portion from the first position to the second position. At some point thereafter, with the movable portion still in the second position, electrical power is ceased to be provided to the electrically operable device. A suitable timing circuit may be used to control when the provision of electrical power to the electrically operable device is ceased.

(c) The movable portion is moved from the first position to the second position and then back to the first position. At some time when the movable portion is in the second position, electrical power is provided to the electrically operable device. When the movable portion is moved back to the first position (the duration of the movable portion being in the second position may be 1-2 seconds or less) electrical power continues to be provided to the electrically operable device for some time thereafter. A suitable timing circuit or the like may be used to cease the provision of electrical power to the electrically operable device at some time after the movable portion being moved from the second position to the first position.

(d) The movable portion is moved from the first position to the second position and then from the second position to the first position (the duration of the movable portion being in the second position may be 1-2 seconds or less). Upon moving from the second position back to the first position electrical power is provided to the electrically operable device. The provision of electrical power to the electrically operable device may be ceased by moving the movable portion from the first position to the second position and then back to the first position.

(e) The movable portion is moved from the first position to the second position and then from the second position to the first position (the duration of the movable portion being in the second position may be 1-2 seconds or less). Upon moving from the second position back to the first position electrical power is provided to the electrically operable device for a certain duration thereafter. The provision of electrical power to the electrically operable device may be ceased by a suitable timing circuit or the like.

In any of the above switching operations (a)-(e) there may be additional polling circuitry to ensure the movable portion is in the first and/or the second position before electrical power to the electrically operable device is provided thereto or ceased being provided thereto.

Figure 2:
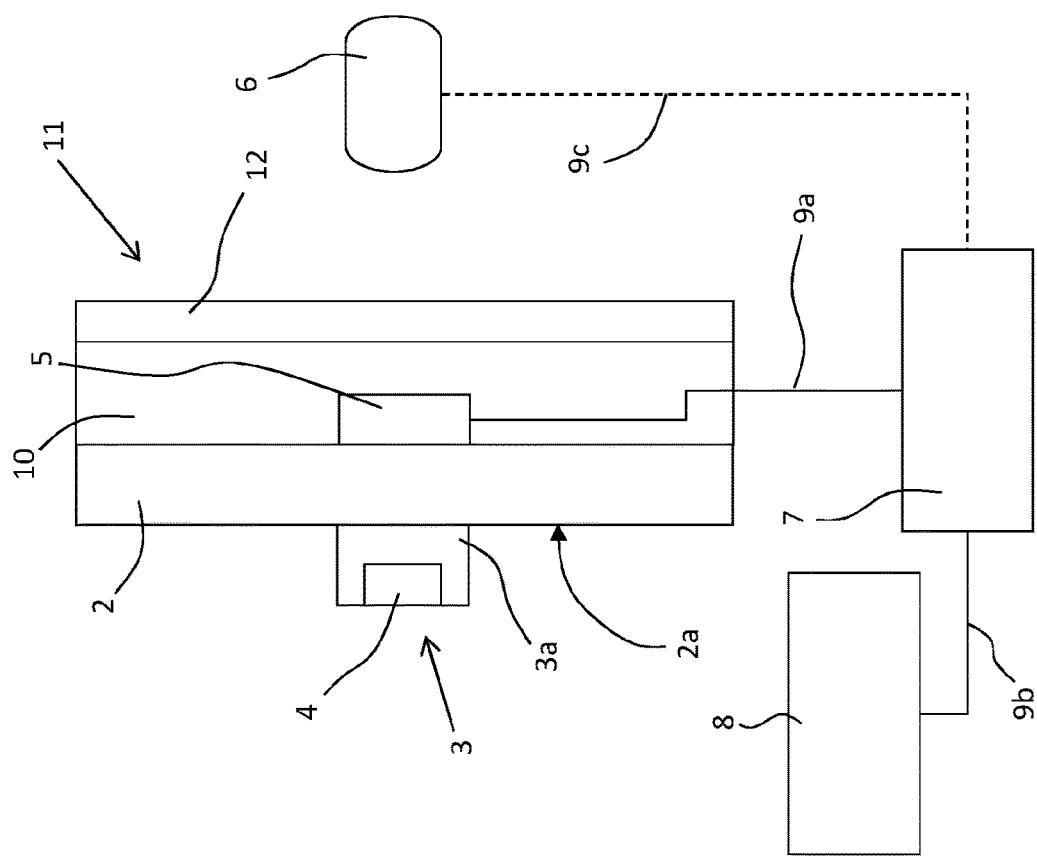
FIG. 2 shows a schematic representation of another switchable device according to the present invention.

The present invention may be used with more than one pane of glazing material, for example a laminated glazing pane as is illustrated in FIG. 2.

In FIG. 2, there is shown another switchable device 11. The switchable device 11 is similar to the switchable device 1 shown in FIG. 1 with like parts being labelled as with reference to FIG. 1, except in FIG. 2 the sensor 5 is located between the first sheet of glazing material 2 and a second sheet of glazing material 12. In this example the first and second sheets of glazing material 2, 12 are joined to each other by an adhesive sheet of interlayer material such as polyvinyl butyral (PVB) 10 that is coextensive with the first and second sheets of glazing material 2, 12. In the art, the assembly of first sheet of glazing material 2 joined to second sheet of glazing material 12 by a sheet of PVB 10 would be known as a laminated glazing pane.

In an alternative embodiment to that shown, the first sheet of glazing material 2 is spaced apart from the second sheet of glazing material 12 by an air space, and the first and second sheets of glazing material are joined together by a perimeter seal. In the art such an assembly would be known as an insulated glazing pane. The air space may be a low-pressure space.

The switchable device 11 functions in the same way as the switchable device 1 by operation of the switch 3.

FIG. 3 shows a type of sensor assembly 100 for use in a switching device according to the present invention. The sensor assembly 100 may be incorporated into a window or door, in particular a laminated glazing. FIG. 4 is a plan view of the sensor assembly 100 shown in FIG. 3 i.e. when viewed in the direction of arrow 102, which is normal to the first major surface 105 of the substrate 103.

With reference to FIGS. 3 and 4, the sensor assembly 100 comprises a substrate 103 having a first major surface 105 and an opposing second major surface 107. In this example the substrate 103 is polyethylene terephthalate (PET) and is optically transparent. The thickness of the substrate 103 is about 0.2 mm and the substrate is relatively flexible. In other embodiments the substrate 103 may be optically opaque. The substrate may be 25 μm-1 mm thick.

Mounted on the first major surface 105 of the substrate 103 is a sensor 109. In this embodiment the sensor 109 is a Hall effect sensor that can sense magnetic fields and magnetic flux direction. A suitable Hall effect sensor is an "A1171: Micropower Ultrasensitive Hall Effect Switch" available from Allegro™ MicroSystems, LLC (www.allegromicro.com).

Also mounted on the first major surface 105 of the substrate 103 is a light emitting diode (LED) 111 operable to produce visible light.

First, second and third electrical contacts 113, 115, 117 are disposed on the first major surface 105 of the substrate 103. The first electrical contact 113 is in electrical communication with a first input of the sensor 109 via electrically conductive track 119. The second electrical contact 115 is in electrical communication with a second input of the sensor 109 via electrically conductive track 121. The first and second electrical contacts 113, 115 may be used to provide electrical power to the sensor 109.

The second electrical contact 115 is also in electrical communication with a first input of LED 111 via electrically conductive track 123, the electrically conductive track 123 also being in electrical communication with electrically conductive track 121.

The third electrical contact 117 is in electrical communication with a second input of the LED 111 via electrically conductive track 125.

Electrical power may be supplied to the LED 111 by electrically connecting the second and third electrical contacts 115, 117 to a suitable power supply.

The second electrical contact 115 is a common contact and may be at zero volts.

Also disposed on the first major surface 105 of the substrate 103 are fourth and fifth electrical contacts 133, 135.

The sensor 109 has two output terminals 109a and 109b. An electrically conductive track 127 is in electrical communication at one end with the first output terminal 109a and at the other end with fourth electrical contact 133. An electrically conductive track 129 is in electrical communication at one end with the second output terminal 109b and at the other end with fifth electrical contact 135. The fourth and fifth electrical contacts 133, 135 are also disposed on the first major surface 105 in the same manner as the first, second and third electrical contacts 113, 115, 117.

With particular reference to the "A1171: Micropower Ultrasensitive Hall Effect Switch" under default conditions the device activates outputs 109a, 109b switching with either a north or south polarity magnetic field of sufficient strength. The magnetic actuation can be set via an external selection pin to operate in a unipolar mode, switching either output 109a or 109b on a sufficient strength north or south polarity detection.

When incorporating the sensor assembly 100 between two panes of glazing material, for example a laminated glazing as shown in FIG. 2, a portion 139 of the sensor assembly 100 may extend beyond the periphery of the panes of glazing material to allow power to be provided to the first, second and third electrical contacts 113, 115, 117 to power the sensor 109 and LED 111, and to be able to measure the output of the sensor 109 by measuring the signal from the fourth and fifth electrical contacts 133, 135.

Each of the tracks 119, 121, 123, 125, 127, 129 may be an electrically conductive ink that has been printed onto the first major surface 105 of the substrate 103. Alternatively, the tracks may copper tracks of the type found in a conventional circuit board.

In an alternative embodiment to that shown in FIG. 3, at least one of the electrically conductive tracks 119, 121, 123, 125, 127, 129 may be on the second major surface 107 of the substrate 103. In such embodiments the electrically conductive pathway may extend between the second and first major surfaces of the substrate in order to make electrical connection with sensor 109 and/or LED 111.

To operate the sensor assembly 100, the first and second electrical contacts 113, 115 are in electrical communication with a suitable power supply to provide electrical power to the sensor 109. In this example the sensor is a Hall effect sensor configured such that upon detecting a magnetic field, output signals are produced at the first and second output terminals 109a, 109b. The fourth and fifth electrical contacts are in electrical communication with a suitable controller (not shown) configured such that upon receiving the output signal from the sensor 109, the controller actuates an electrically operable device (not shown) by allowing electrical current to flow to the electrically operable device i.e. the electrically operable device is switched to an "on" state. In addition, the controller may allow the flow of electrical current to the second and third electrical contacts 115, 117 thereby providing electrical power to the LED 111 to illuminate the LED 111. When the Hall effect sensor detects a change in magnetic field, the controller may cease electrical power to the electrically operable device and LED 111 i.e. both are switched to an "off" state. The controller may be configured to continue to provide electrical power to the LED 111 and/or electrically operable device until another change in magnetic field is sensed by the Hall effect sensor 109.

In an alternative embodiment to that shown in FIGS. 3 and 4, the substrate 103 is a sheet of glass, in particular soda-lime-silica glass. The sheet of glass may be annealed, thermally toughened, or chemically strengthened. In another alternative, in addition to a glass substrate as just described, instead of discrete tracks formed by example of an electrically conductive ink screen printed onto the first major surface 105 of the glass substrate 103, the glass substrate 103 may instead comprise an electrically conductive coating deposited over the first major surface 105. Such an electrically conductive coating may then be sectionalised to provide discrete conductive regions for electrically connecting the various components of the sensor assembly thereto. Such electrically conductive coatings may be deposited by atmospheric pressure chemical vapour deposition.

FIGS. 5 and 6 illustrate one way in which the sensor assembly 100 may be incorporated into a laminated glazing 130.

FIG. 5 shows a schematic exploded isometric view of a laminated glazing 130. FIG. 6 shows a schematic cross-sectional view of the laminated glazing 130 of FIG. 5 through the line X-X".

With reference to FIGS. 5 and 6, the laminated glazing 130 comprises a first sheet of glass 132 and a second sheet of glass 142. The first sheet of glass 132 has a first major surface 132a and an opposing second major surface 132b. The second sheet of glass 142 has a first major surface 142a and an opposing second major surface 142b.

Between the first and second sheets of glass are two adhesive interlayer plies 154 and 156. Each adhesive interlayer ply is coextensive with each other and with the sheets of glass 132, 142 such that the sheets of glass and the adhesive interlayer plies shown in FIG. 5 are congruently stacked. In the art, an adhesive interlayer ply is sometime known as a sheets of adhesive interlayer material.

The glass sheets 132, 142 are each 2.1 mm thick and the adhesive interlayer plies are each 0.38 mm thick. The glass sheets 132, 142 and/or the adhesive interlayer plies may have different thicknesses. Each of the glass sheets 132, 142 may be 0.7 mm to 25 mm thick. Each of the glass sheets may be less than 12 mm thick or less than 10 mm thick or less than 8 mm thick. Each of the adhesive interlayer plies 154, 156 may be 0.3 mm to 1.2 mm thick, for example 0.76 mm thick.

The sensor assembly 100 is positioned between the adhesive interlayer plies 154, 156 such that portion 139 thereof extends beyond the periphery of the laminated glazing 130 to allow electrical connections to be made to the electrical contacts 113, 115, 117, 133, 135 on the substrate of the sensor assembly 100.

In a variation to the example shown in FIGS. 5 and 6, only one ply of adhesive interlayer material (either 154 or 156) is provided between the glass sheets 132, 142.

FIG. 7 shows a schematic exploded perspective view of another laminated glazing 230. FIG. 8 shows a schematic cross-sectional view of the laminated glazing 230 of FIG. 7 through the line Y-Y".

In this example the laminated glazing 230 comprises a first glass pane 232 joined to a second glass pane 242 by means on an interlayer structure 258. The interlayer structure 258 comprises three plies of adhesive interlayer material (i.e. PVB, EVA or combinations thereof) 254, 256 and 257 The first ply of adhesive interlayer material 254 is coextensive with the first sheet of glass 232. The second ply of adhesive interlayer material 256 is coextensive with the second sheet of glass 242. The third ply of adhesive interlayer material 257 is located between the first and second sheets of adhesive interlayer material 254, 526 and has a cut-out region therein to accommodate the sensor assembly 100. The cut-out region is along one edge of the third sheet of adhesive interlayer material and the other three edges thereof are aligned with the respective edges of the first and second plies of adhesive interlayer material.

FIG. 7 is representative of the stack of unlaminated components that may be laminated together using conventional lamination processes, for example using suitably high temperature and pressure.

In the final laminated glazing as shown in FIG. 8, the sensor assembly 100 is between the first and second plies of adhesive interlayer material 254, 256 and is located in the cut-out region of the third ply of adhesive interlayer material 257. Such a construction makes lamination simpler as the extra third ply of adhesive interlayer material (compared to the two-ply adhesive interlayer structure of the laminated glazing 130) makes it easier to accommodate the thickness of the sensor assembly 100 in between the first and second plies of adhesive interlayer material.

In the final laminated glazing 230 the first ply of adhesive interlayer material 254 is adjacent and in contact with the first sheet of glass 232 and the second ply of adhesive interlayer material 256 is adjacent to and in contact with the second sheet of glass 242. The third ply of adhesive interlayer material 257 is in contact with both the first and second plies of adhesive interlayer material 254, 256.

A portion 139 of the sensor assembly 100 extends beyond the periphery of the laminated glazing 230 to allow electrical connections to be made to the electrical contacts 113, 115, 117, 133, 135 on the substrate of the sensor assembly 100.

In a variant to that shown in FIGS. 7 and 8, there may be more plies of adhesive interlayer material in the interlayer structure 258.

In another variant to that shown in FIGS. 7 and 8, there may be at least one further ply of adhesive interlayer material between the first and/or second ply of adhesive interlayer material 254, 256 and the respective sheet of glass 232, 242. In such embodiments it is preferred for the at least one further ply of adhesive interlayer material to be separated from the first and second plies of adhesive interlayer material by at least one non-adhesive interlayer ply such at polyethylene terephthalate (PET).

In other variants to that shown in FIGS. 7 and 8, one of the plies of adhesive interlayer material 254 or 256 may not be present. In another variant, both plies of adhesive interlayer material 254, 256 may not be present.

In another variant the interlayer structure 258 comprises at least one ply of non-adhesive interlayer material, such as PET, with a ply of adhesive interlayer material in contact with opposing major surfaces thereof.

Figure 9:
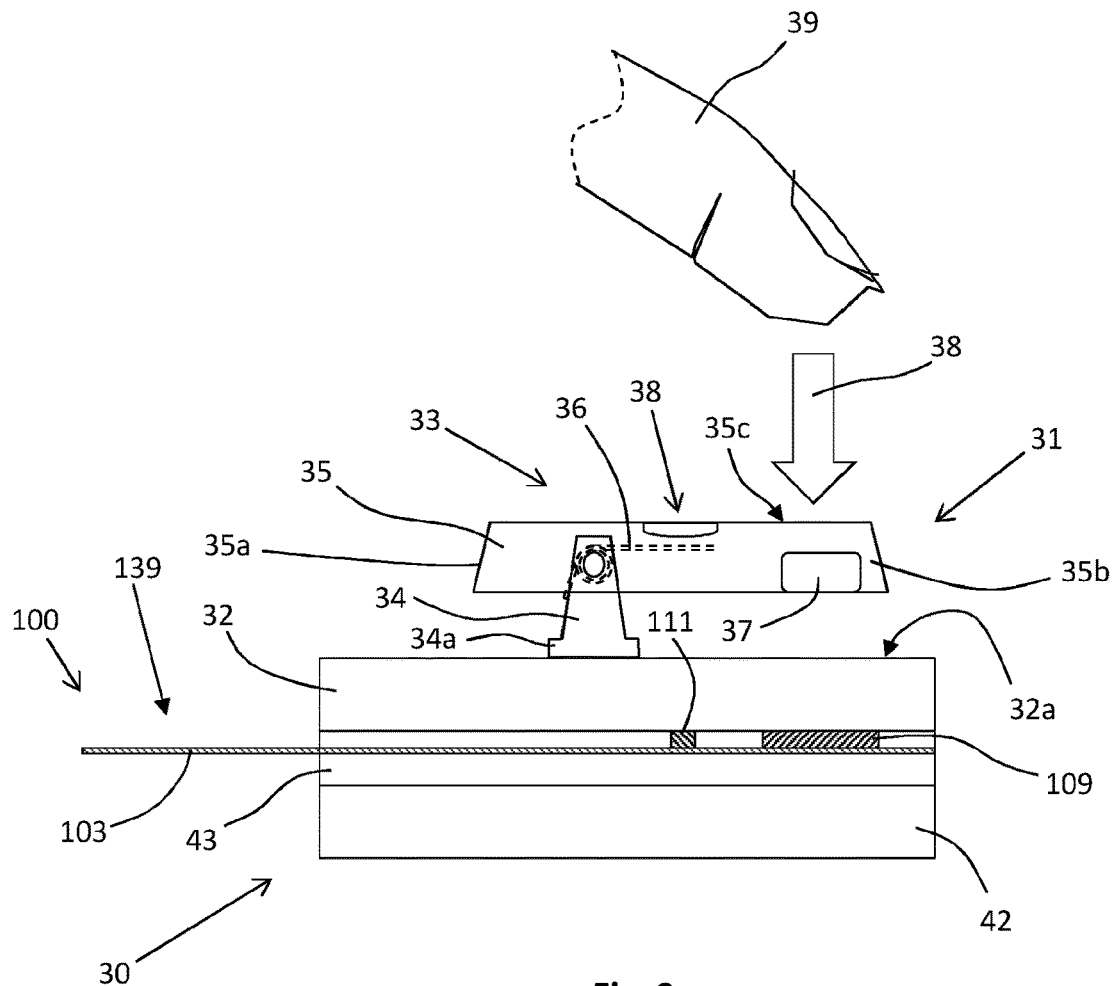
FIG. 9 shows a schematic cross-sectional representation of a switchable device in accordance with the present invention, the switchable device being in a first configuration.

FIG. 9 shows a schematic cross-sectional representation of a switchable device 31 in accordance with the present invention.

In this embodiment the switchable device 31 comprises a spring biased switch 33. The spring biased switch 33 comprises a pivot portion 34 and a body portion 35 mounted for rotation on the pivot portion 34. The pivot portion 34 has one end proximate the body portion 35 for providing a pivot axis and an opposing end comprising a foot 34a that is attached to major surface 32a of the glass sheet 32 by a suitable adhesive.

The glass sheet 32 is a first pane of a laminated glazing 30. The laminated glazing 30 comprises first glass sheet 32 joined to second glass sheet 42 by a ply of adhesive interlayer material 43, such as a sheet of PVB. The first and second glass sheets 32, 42 may be joined together by more than one ply of adhesive interlayer material, for example as shown in FIGS. 6 and 8.

Located between the first sheet of glass 32 and the second sheet of glass 42 is at least a portion of a sensor assembly 100 as previously described with reference to FIGS. 3 and 4.

The body portion 35 of the switch 33 has an end 35a proximate the pivot portion 34 and a distal end 35b. A spring 36 coupled to the pivot portion 34 biases the body portion 35 such that in an "at-rest state", the distal end 35b of the body portion 35 is not in contact with the major surface 32a of the first glass sheet 32. The body portion 35 of the switch 33 is in a first position.

A permanent magnet 37 is located in a recess in the distal end 35b of the body portion 35. When the upper surface 35c of the distal end 35b of the body portion 35 is pressed towards the first glass sheet 32 i.e. in the direction of arrow 38 by pressing the switch with a human finger, the body portion 35 rotates about the pivot portion 34 thereby moving the permanent magnet 37 towards the sensor 109 (which is a Hall effect sensor). The body portion 35 moves to a second position as shown. The Hall effect sensor is able to detect the change in magnetic field due to the movement of the permanent magnet towards the first major surface 32a of the first glass sheet 32 and an output signal is sent from the Hall effect sensor to a controller for actuating an electrically operable device as previously described.

Figure 10:
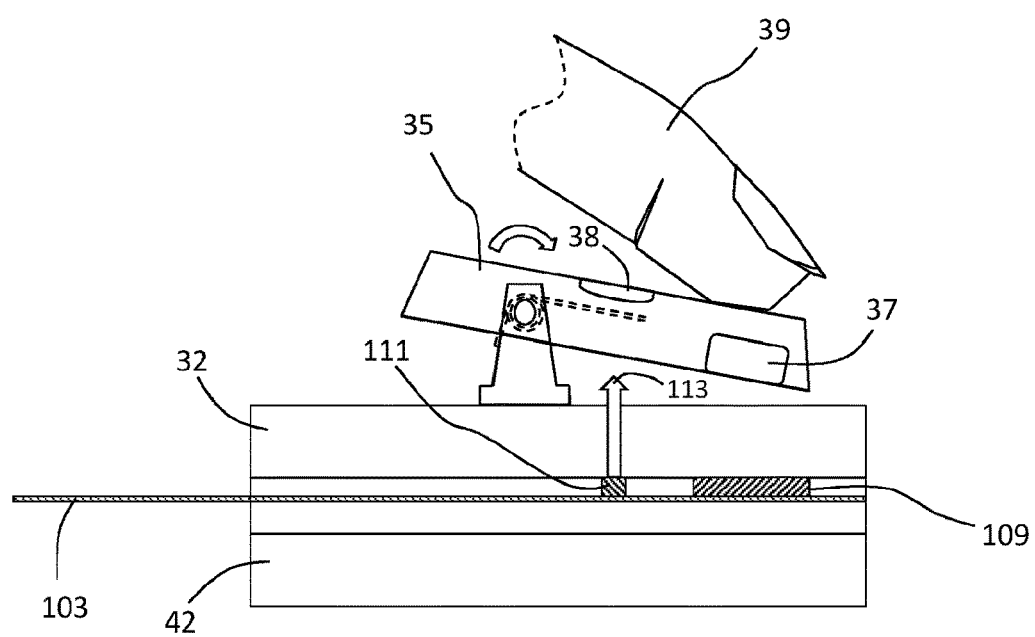
FIG. 10 shows a schematic cross-sectional representation of the switchable device of FIG. 9 in a second configuration.

In this example the body portion 35 also includes a cut out region 38 in alignment with the LED 111 of the sensor assembly 100 (the LED 111 being between the first and second glass sheets 32, 42). Once the switch 33 has been pressed (as shown in FIG. 10) and the electrically operable device has been turned "on" i.e. energised, the controller also sends a control signal to switch on the LED 111 thereby causing the LED 111 to emit visible light (as indicated by arrow 113).

The visible light emitted by the LED 111 is observable through the cut-out region 38 in the body portion 35. A suitable optical diffuser may be incorporated in the cut-out region 38 of the body portion to diffuse the light emitted by the LED 111.

Upon releasing the switch, the biasing force of the spring 36 returns the body portion 35 to the configuration shown in FIG. 9 i.e. back to the "at-rest state" (the first position). The controller may be configured such that upon returning to this configuration, the electrically operable device is switched off and the LED 111 is also turned off. Alternatively, the electrically operable device may remain switched on, and the LED 111 also remains illuminated to indicate the electrically operable device is switched on. In this embodiment, the electrically operable device would be switched off by pressing the body portion 35 again and using a suitably configured controller.

In an alternative to the embodiment to that shown in FIG. 9, the spring biased switch 33 does not have a permanent magnet located in the recess in the distal end 35b of the body portion 35. Instead, the spring biased switch 33 is configured to generate an acoustic signal (i.e. a "click") upon being pressed towards the first glass sheet in the direction of arrow 38. To detect this acoustic signal, the sensor 109 is not a Hall effect sensor, but is instead replaced with a suitable acoustic sensor that is operable to detect the acoustic signal. Upon releasing the switch, the same or another acoustic signal may or may not be produced.

FIG. 10 illustrates the configuration of the switching device 31 when the body portion 35 is being pressed by a finger 39 i.e. the body portion 35 is in a second position.

Figure 11:
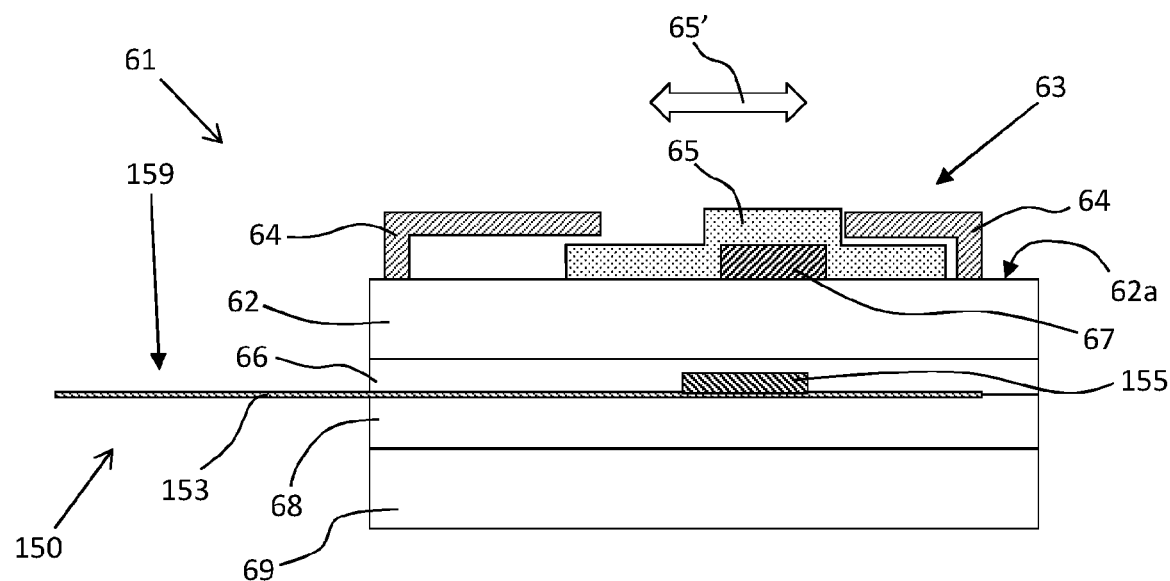
FIG. 11 shows a schematic cross-sectional representation of another switchable device in accordance with the present invention, the switchable device being in a first configuration.

FIG. 11 shows another switching device 61 that is similar to the switching device 31, but instead of a pressable switch, the switch has a linearly slidable portion.

The switching device 61 comprises a first sheet of glass 62 and a second sheet of glass 69. In between the first and second sheets of glass 62, 69 are first and second plies of adhesive interlayer material 66, 68 i.e. PVB. In between the first and second plies of adhesive interlayer material 66, 68 is a portion of a sensor assembly 150.

The first ply of adhesive interlayer material 66 is between the first sheet of glass 62 and the sensor assembly 150. The second ply of adhesive interlayer material 68 is between the second sheet of glass 69 and the sensor assembly 150.

The sensor assembly 150 is similar to the sensor assembly 100 and comprises a substrate 153 having on a major surface thereof a Hall effect sensor 155. Suitable electrically conductive pathways and electrical contact regions (as previously described) are also on the substrate 153 to allow power to be supplied to the Hall effect sensor and to obtain signals from the Hall effect sensor upon sensing a magnetic field and/or a changing magnetic field.

The assembly of first and second sheets of glass 62, 69, first and second plies of adhesive interlayer material 66, 68 and sensor assembly are laminated to form a laminated glazing. A portion 159 of the sensor assembly 150 extends beyond the periphery of the laminated glazing to allow access to the electrical contacts, as previously described with reference to portion 139 of FIGS. 3, 4, 9 and 10.

Attached to the major surface 62a of the first sheet of glass 62 is a switch 63. The switch 63 comprises a housing 64 fixed to the major surface 62a by means of a suitable adhesive. Positioned inside the housing 64, the switch comprises a slidable portion 65 that is linearly slidable in the housing 64 i.e. in the direction of arrow 65'.

Mounted in a recess portion of the slidable portion 65 is a permanent magnet 67.

Figure 12:
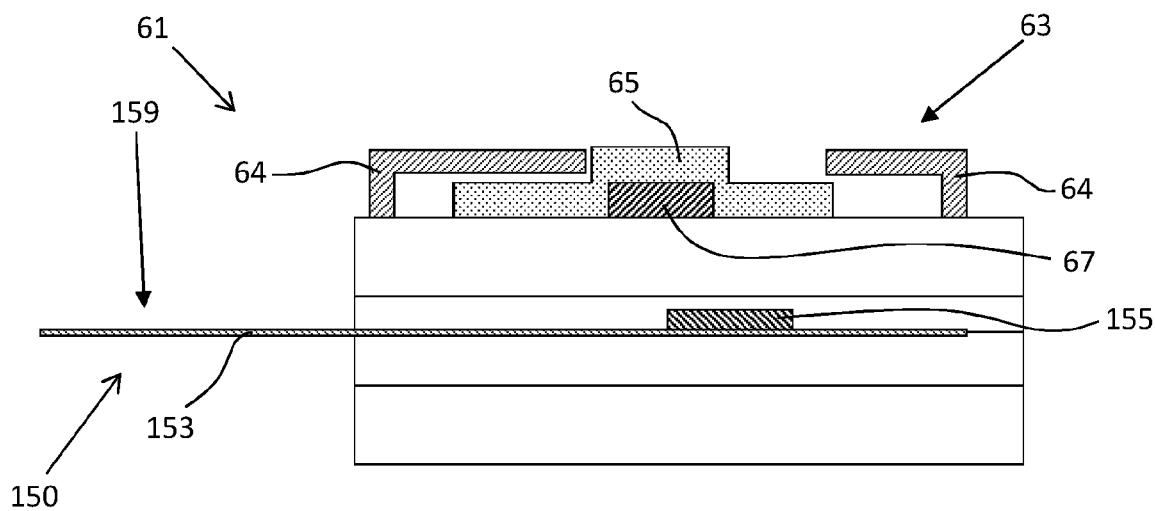
FIG. 12 shows a schematic cross-sectional representation of the switchable device of FIG. 11 in a second configuration.

Upon sliding the slidable portion 65 from the position shown in FIG. 11 (i.e. a first position) to the position shown in FIG. 12 (i.e. a second position), the Hall effect sensor 155 is able to detect the change in magnetic field due to the movement of the permanent magnet 67 relative to the Hall effect sensor. That is, the slidable portion 65 is magnetically coupled with the sensor assembly 150.

The output from the Hall effect sensor 155 may then be used to actuate an electrically operable device as previously described.

In a variant to the embodiment shown in FIGS. 11 and 12, the switch 63 has a rotatably slidable portion (in a suitable housing) instead of a linearly slidable portion.

For a linearly or rotatably slidable portion, the relative position of the portion i.e. between first and second positions, may be used to provide an output signal from the sensor that is proportional to the difference between the signal from the sensor when the portion is in the first and second positions.

Figure 13:
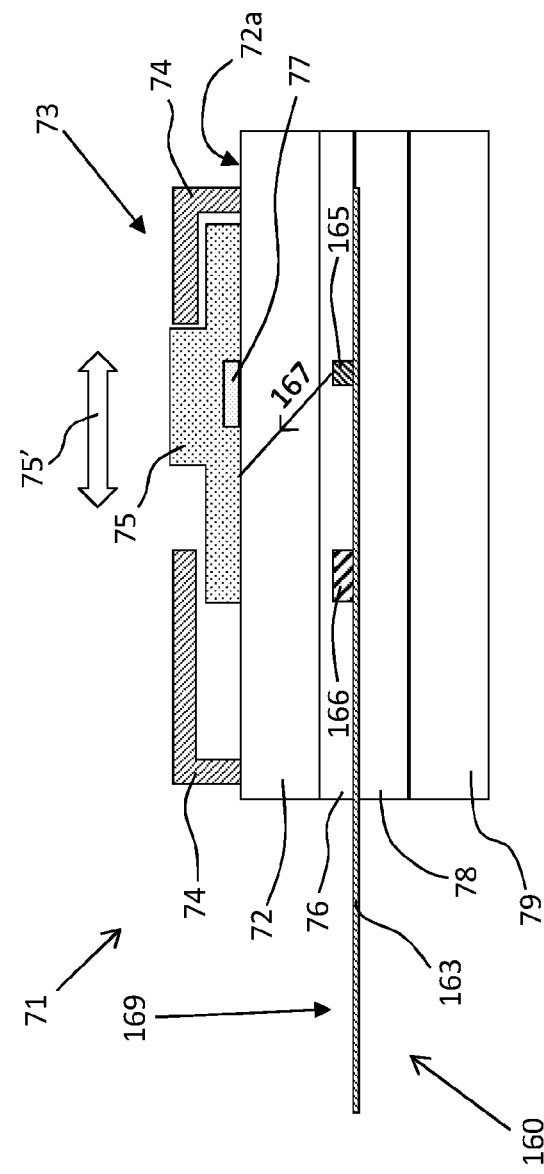
FIG. 13 shows a schematic cross-sectional representation of another switchable device in accordance with the present invention, the switchable device being in a first configuration.

In FIG. 13 there is shown another switching device 71 according to the present invention wherein the movable portion of the switch is optically coupled with the sensor assembly.

The switching device 71 comprises a first sheet of glass 72 and a second sheet of glass 79. In between the first and second sheets of glass 72, 79 are first and second plies of adhesive interlayer material 76, 78. In between the first and second plies of adhesive interlayer material 76, 78 is a portion of a sensor assembly 160.

The first ply of adhesive interlayer material 76 is between the first sheet of glass 72 and the sensor assembly 160. The second ply of adhesive interlayer material 78 is between the second sheet of glass 79 and the sensor assembly 160.

Figure 15:
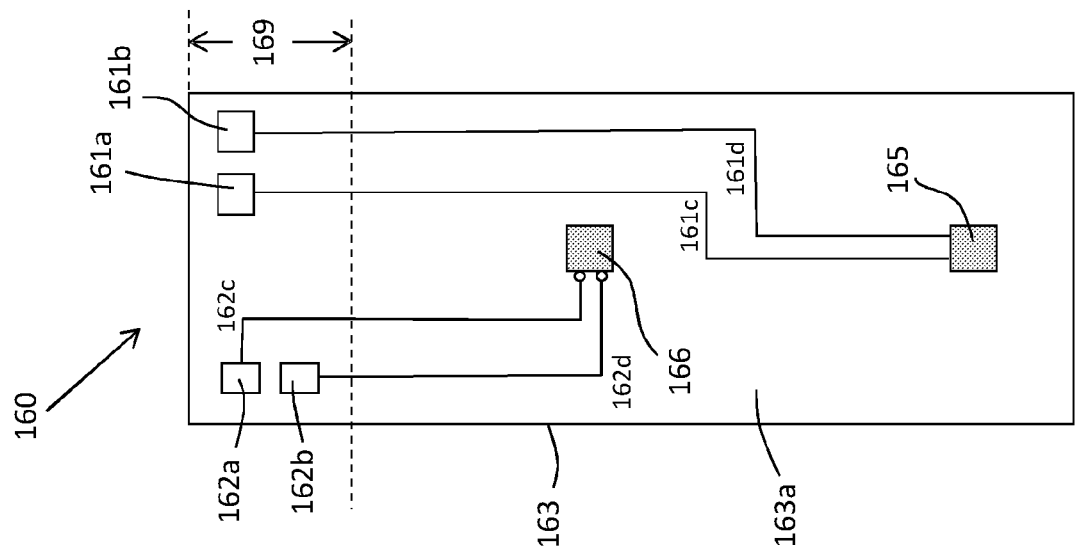
FIG. 15 is a plan view of the sensor assembly used in the switchable device shown in FIGS. 13 and 14.

With further reference to FIG. 15, the sensor assembly 160 comprises a substrate 163 having on a major surface thereof a transmitter portion that is a light emitting diode (LED) 165 and a sensor portion that is a photodiode 166 operable to detect light having wavelengths emitted by the LED 165. Suitable electrically conductive pathways and electrical contact regions are also on the substrate 163 to allow power to be supplied to the LED and photodiode and to obtain a signal from the photodiode 166 upon sensing light from the LED 165 as will be described hereinafter.

The assembly of first and second sheets of glass 72, 79, first and second plies of adhesive interlayer material 76, 78 and sensor assembly 160 are laminated to form a laminated glazing. A portion 169 of the sensor assembly 160 extends beyond the periphery of the laminated glazing to allow access to the electrical contacts, as previously described with reference to portion 139 of FIGS. 3, 4, 9 and 10.

Attached to the major surface 72a of the first sheet of glass 72 is a switch 73. The switch 73 is similar to the switch 63 previously described. The switch 73 comprises a housing 74 attached to the major surface 72a by means of a suitable adhesive. Positioned inside the housing 74, the switch comprises a linearly slidable portion 75 slidable in the housing 74 i.e. in the direction of arrow 75' between a first position and a second position. The linearly slidable portion 75 is a movable portion of the switch 73.

The linearly slidable portion 75 has an upper surface for contact with a human finger and a lower surface facing the major surface 72a. A portion of the lower surface of the linearly slidable portion 75 is a portion reflective to electromagnetic radiation emitted by the transmitter portion; that is, a mirror 77 being reflective to light emitted from the LED 165.

The LED 165 is configured to emit a beam of light 167 towards the major surface 72a of the first sheet of glass. As shown in FIG. 13, the mirror 77 is not in a position to reflect the beam of light 167. As such, no signal is output from the photodiode 166.

Figure 14:
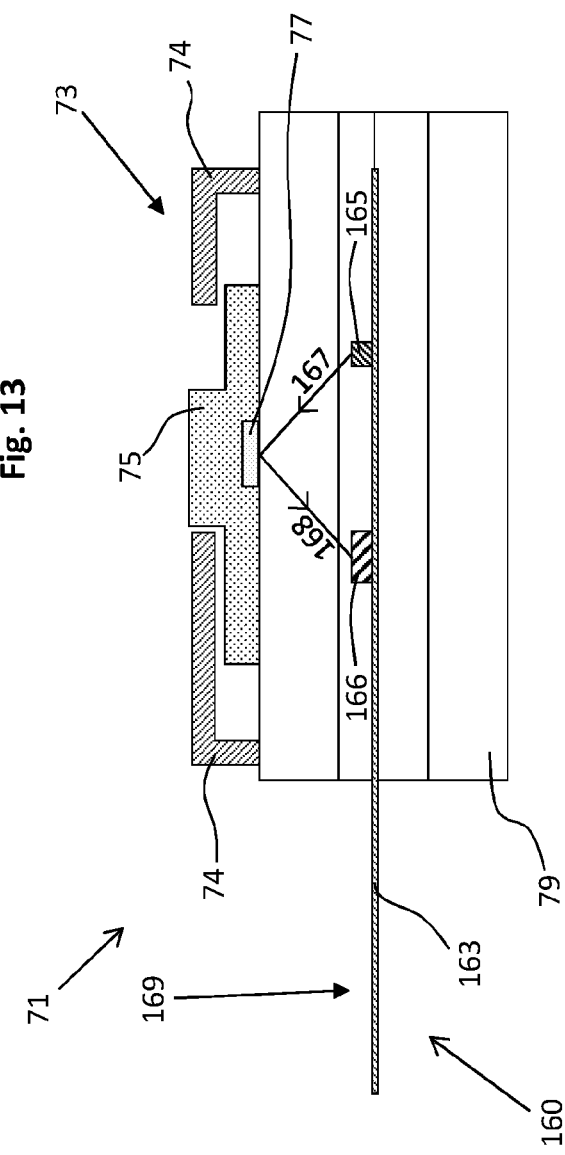
FIG. 14 shows a schematic cross-sectional representation of the switchable device of FIG. 13 in a second configuration.

The photodiode 166 is arranged on the substrate 163 such that upon moving the linearly slidable portion 75 from the first position as shown in FIG. 1 to the second position as shown in FIG. 14, the mirror portion 77 is moved to a position to reflect light from the LED 165, shown as beam 168 in FIG. 14. The reflected beam 168 reaches the photodiode 166 and the photodiode 166 detects the change in reflected light to produces an output signal that is sent to a suitable control to turn on (or off) an electrically operable device. Moving the linearly slidable portion 75 back to the position shown in FIG. 13 (i.e. from the second position to the first position) such that the light 167 from the LED 165 no longer is reflected off the mirror portion 77, causes a change in the signal detected by the photodiode 166. This change in signal from the photodiode 166 can be used to switch the electrically operable device off.

Instead of a linearly slidable portion, a rotatable portion may be used instead, whereby rotating the rotatable portion moves a mirror such that light from the LED may be reflected off the mirror onto the photodiode.

FIG. 15 shows a plan view of the sensor assembly 160 that is shown incorporated in the switching device shown in FIGS. 13 and 14.

The sensor assembly 160 comprises a substrate 163 of PET, being optically transparent and having a thickness of about 0.2 mm.

Mounted on a first major surface 163a of the substrate 163 is a light emitting diode (LED) 165 operable to produce visible light. Also mounted on the major surface 163a of the substrate 163 is a photodiode 166 having a sensor portion sensitive to light emitted by the LED 165.

First and second electrical contacts 161a, 161b are disposed on the first major surface 163a of the substrate 163. The first electrical contact 161a is in electrical communication with a first input of the LED 165 via electrically conductive track 161c. The second electrical contact 161b is in electrical communication with a second input of the LED 165 via electrically conductive track 161d. The first and second electrical contacts 161a, 161b may be used to provide electrical power to the LED 165 such that upon connecting the first and second electrical contacts 161a, 161b to a suitable power supply, the LED 165 emits visible light.

Also disposed on the first major surface 163a of the substrate 163 are third and fourth electrical contacts 162a, 162b.

The photodiode has first and second output terminals for providing an output signal when the photodiode detects light. The third electrical contact 162a is in electrical communication with the first output of the photodiode 166 via electrically conductive track 162c. The fourth electrical contact 162b is in electrical communication with the second output of the photodiode 166 via electrically conductive track 162d. The third and fourth electrical contacts 162a, 162b are also disposed on the first major surface 163a in the same manner as the first and second electrical contacts 161a, 161b.

The electrically conductive tracks 161c, 161d, 162c, 162d may be screen printed onto the first major surface 163a of the substrate 163.

A region 169 of the sensor assembly is indicated and this region 169 is arranged to be outside of the periphery of the laminated glazing into which said sensor assembly 160 will be incorporated, as shown in FIGS. 13 and 14.

FIG. 16 shows another switching device 81 that also obtains a switch signal by optical means. In this example, a resilient button 83 is attached to the major surface 82a of glass sheet 82. The resilient button has a hollow dome shaped body portion 84, having an upper surface for contact by a finger and a lower surface facing the glass sheet 82. Positioned between the lower surface of the hollow dome shaped body portion 84 and a portion of the major surface 82a is a reflective material 85. In this example the reflective material 85 is a button shaped piece of reflective material, such as a metal, in particular stainless steel or a beryllium copper alloy that is compressible when the resilient button 83 is pressed i.e. when the hollow dome shaped body portion 84 is compressed towards the glass sheet 82. The button shaped piece of reflective material 85 fits inside the hollow dome shaped body portion 84. It is preferred that the reflective material 85 is suitably resistant to corrosion, for example due to exposure to water. In an alternative to the embodiment shown there may instead be a coating of reflective material on the lower surface of the hollow dome shaped body portion 84.

The switching device 81 comprises a first sheet of glass 82 and a second sheet of glass 89. In between the first and second sheets of glass 82, 89 are first and second plies of adhesive interlayer material 86, 88. In between the first and second plies of adhesive interlayer material 86, 88 is a portion of a sensor assembly 170.

The first ply of adhesive interlayer material 86 is between the first sheet of glass 82 and the sensor assembly 170. The second ply of adhesive interlayer material 88 is between the second sheet of glass 89 and the sensor assembly 170.

The sensor assembly 170 comprises a substrate 173, an LED 175 and a photodiode 176 and is similar to the sensor assembly 160 previously described. In this example, both the LED 175 and photodiode 176 are mounted on the substrate 173, but one or both may be mounted directly onto one of the first or second glass sheets 82, 89.

In the example shown, suitable electrically conductive pathways and electrical contact regions are also on the substrate 173 to allow power to be supplied to the LED 175 and photodiode 176 and to obtain a signal from the photodiode 176 as will be described hereinafter in more detail. The LED 175 is configured to emit a beam of light 177 through the first pane of glass 82 towards the reflective material 85 for reflection off the button shaped piece of reflective material 85, the reflective material 85 being adjacent the lower surface of the hollow dome shaped body portion 84. Light (shown as beam 178) is reflected off the button shaped piece of reflective material 85 and is detected by the photodiode 176, thereby producing an output signal from the photodiode 176.

As illustrated in FIG. 17, upon pressing the resilient button i.e. compressing the hollow dome shaped body portion 84 by pressing with a finger, the button shaped piece of reflective material 85 is deformed and/or moves towards the first major surface 82a of the first glass sheet 82, thereby affecting the amount of light reflected therefrom and so reaching the photodiode 176. In FIG. 17 the reflected light beam 178 no longer reaches the photodiode 176 because the direction of the reflected light beam 178 has changed due to the movement of the reflective material 85 as it has been compressed. The photodiode 176 detects this change and an appropriate signal is sent to a suitable controller to actuate an electrically operable device.

Upon releasing the resilient button i.e. no longer pressing the hollow dome shaped body portion 84, the shape thereof returns to the original shape and the light beam 178 reaching the photodiode 176 returns to the original "at rest" state i.e. the direction of the reflected light beam 178 again changes to be incident on the photodiode 176.

The substrate 173 may have an optically opaque region between the LED 175 and photodiode 176 to absorb light from the LED that does not reach the photodiode 176, for example as shown in FIG. 16.

Figure 19:
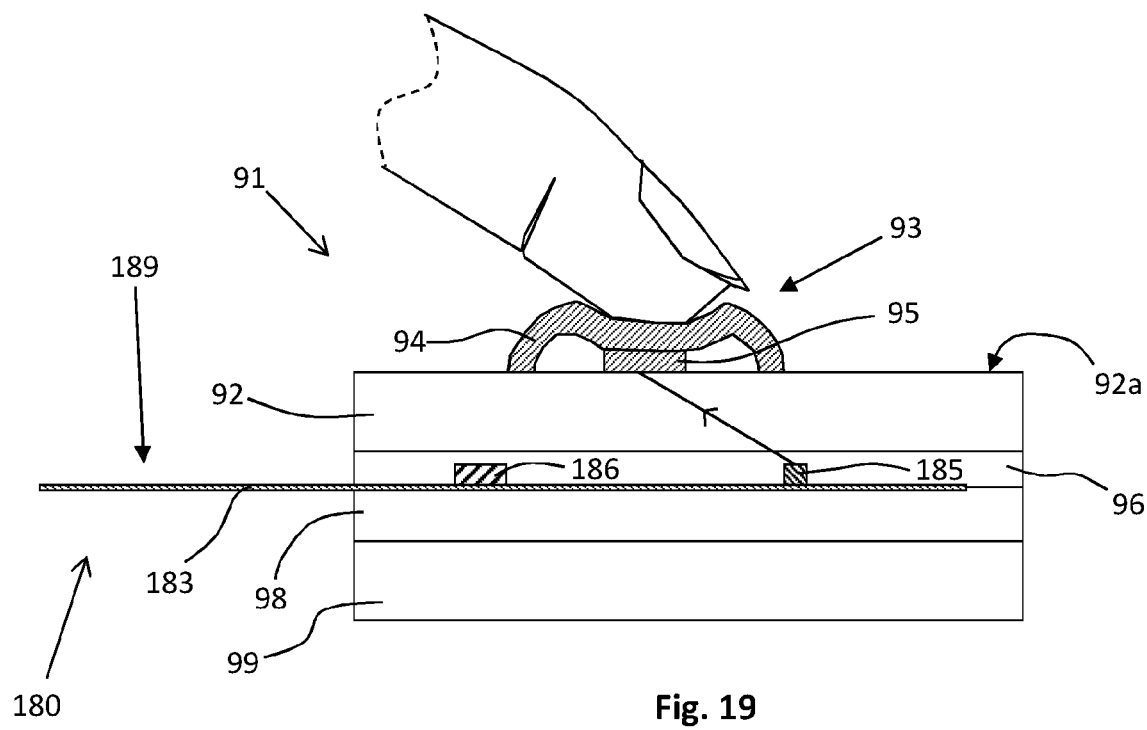
FIG. 19 shows a schematic cross-sectional representation of the switchable device of FIG. 18 in a second configuration.

In FIG. 16 the hollow dome shaped body portion 84 is shown in a first position and in FIG. 19 the hollow dome shaped body portion 84 is shown in a second position.

The direction of the reflected light beam 178 may be defined in terms of the angle between the emitted beam of light 177 and the reflected beam 178. The direction of the reflected beam 178 may be defined relative to a normal on the major surface 82a.

Figure 18:
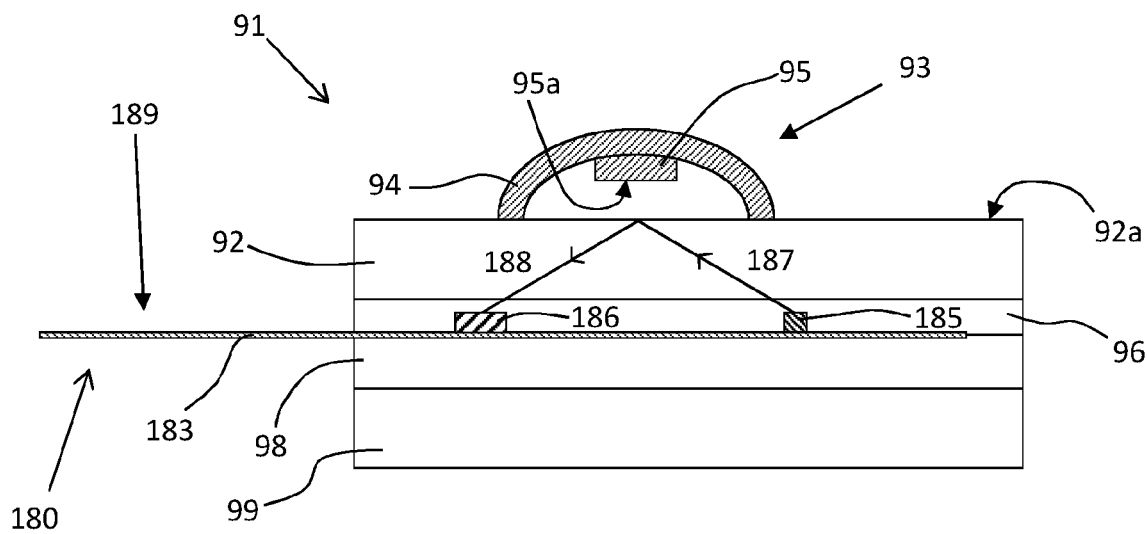
FIG. 18 shows a schematic cross-sectional representation of another switchable device in accordance with the present invention, the switchable device being in a first configuration.

FIG. 18 shows another example where the switchable device obtains a switch signal by optical means.

The switching device 91 comprises a first sheet of glass 92 and a second sheet of glass 99. In between the first and second sheets of glass 92, 99 are first and second plies of adhesive interlayer material 96, 98. In between the first and second plies of adhesive interlayer material 96, 98 is a portion of a sensor assembly 180. The sensor assembly 180 is similar to the sensor assemblies 160, 170 previously described.

The first ply of adhesive interlayer material 96 is between the first sheet of glass 92 and the sensor assembly 180. The second ply of adhesive interlayer material 98 is between the second sheet of glass 99 and the sensor assembly 180.

The first sheet of glass 92 is joined to the second sheet of glass 99 by means of the first and second plies of adhesive interlayer material 96, 98 with a portion of the sensor assembly 180 therebetween. A portion 189 of the sensor assembly extends beyond the edges of the first and second adhesive interlayer plies 96, 98.

The sensor assembly 180 comprises a substrate 183 having on a major surface thereof a light emitting diode (LED) 185 and a photodiode 186. Suitable electrically conductive pathways and electrical contact regions are also on the substrate 183 to allow power to be supplied to the LED and photodiode and to obtain a signal from the photodiode 186 upon sensing light from the LED 185 as will be described hereinafter.

In this example a beam of light 187 is emitted by the LED 185 and strikes the first major surface 92a for total internal reflection therefrom as beam of light 188 to strike the photodiode 186.

Attached to the first major surface 92a of the first glass sheet 92 is a resilient button 93 having a hollow dome shaped body portion 94 and a flat faced contact portion 95 inside the hollow dome shaped portion body 94. The flat faced contact portion 95 is integrally moulded with the hollow dome shaped body portion 94 and has a flat face 95a that is substantially parallel to the first major surface 92a. In FIG. 18 the hollow dome shaped body portion 94 is shown in a first position.

As shown in FIG. 19, by depressing the resilient button 93 the hollow dome shaped body portion 94 deforms and the contact portion 95 is brought into contact with the first major surface 92a in the region thereof where the total internal reflection occurs so that the amount of light that is totally internally reflected from the glass/air interface is disturbed. The amount of light reaching the photodiode 186 changes (in the example shown in FIG. 19 no light reaches the photodiode upon pressing the hollow dome shaped body portion 94 of the switch 93). The flat face 95a may comprise a portion to allow light that would be totally internally reflected to instead escape by suitably refractive index matching the material forming the contact portion 95 and/or flat face 95a with the refractive index of the glass forming the first sheet of glass 92.

Figure 22:
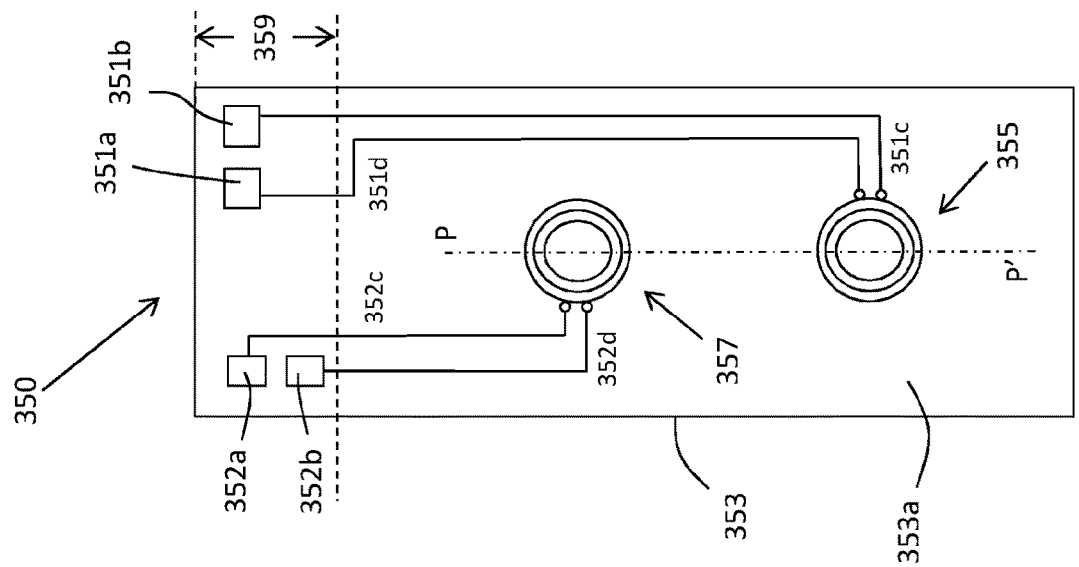
FIG. 22 is a plan view of the sensor assembly used in the switchable device shown in FIGS. 20 and 21.
Figure 20:
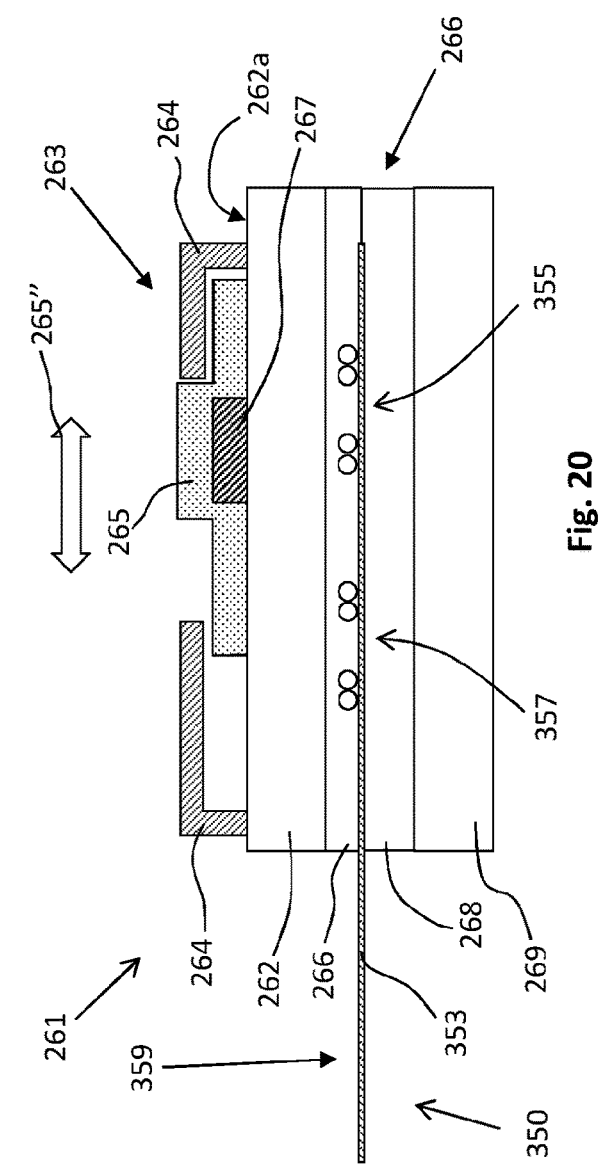
FIG. 20 shows a schematic cross-sectional representation of another switchable device in accordance with the present invention, the switchable device being in a first configuration.
Figure 21:
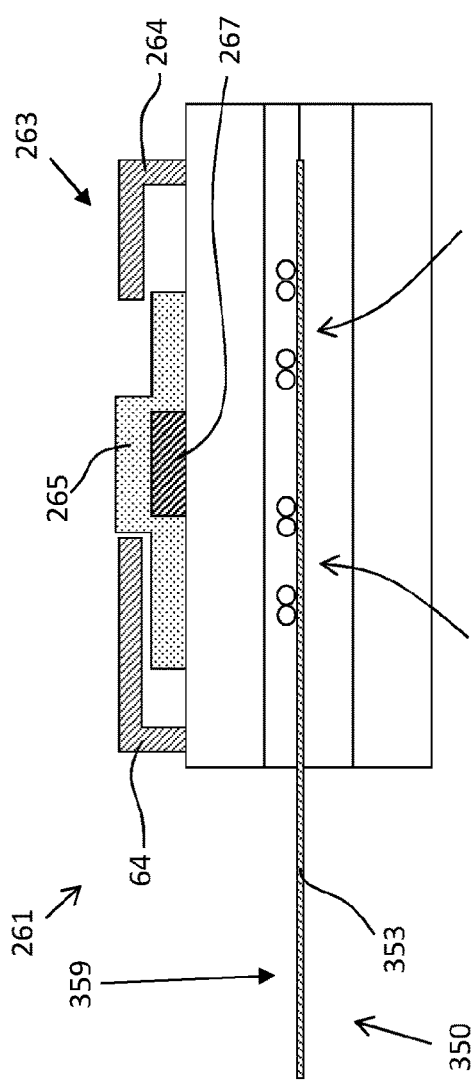
FIG. 21 shows a schematic cross-sectional representation of the switchable device of FIG. 20 in a second configuration.

With reference to FIGS. 20, 21 and 22, there is shown another example of a switchable device using a slidable switch. In this example the slidable switch 263 comprises a housing portion 264 having a portion 265 slidable therein. The slidable portion 265 comprises a metal portion 267 located in a recess portion of the slidable portion 265.

The housing 264 is attached to a laminated glazing 266. The laminated glazing 266 comprises a first sheet of glass 262 joined to a second sheet of glass 269 by means of two adhesive interlayer plies 266, 268. Positioned between the adhesive plies 266, 268 is a portion of a sensor assembly 350. A portion 359 of the sensor assembly 350 extends beyond the periphery of the laminated glazing 266.

The sensor assembly 350 comprises a substrate 353, which may be PET. Mounted on the substrate 353 and located between the first and second sheets of glass 262, 269 are first and second coils 355, 357.

The slidable switch 263 is arranged in relation to the first and second coils 355, 357 such that the metal portion 267 is movable along a straight line joining the centres of the first and second coils 355, 357. The sensor assembly 350 is shown in more detail in FIG. 22.

When the metal portion 267 is moved between the first and second coils 355, 357, the mutual inductance changes which is detectable. Such a switchable device may utilise a transmitter coil and a receiver coil, where the transmitter coil (i.e. the first coil 355) is used to generate a magnetic field. Upon moving the metal portion 267 into the magnetic field generated by the first coil 355, a secondary magnetic field is produced in the metal portion 267 that is detected by the receiver coil (the second coil 357).

In FIG. 20 the slidable portion 265 is shown in a first position and in FIG. 21 the slidable portion 21 is shown in a second position.

FIG. 22 shows a plan view of the sensor assembly 350 that is shown incorporated in the switching device 261 shown in FIGS. 20 and 21.

The sensor assembly 350 comprises a substrate 353 of PET, being optically transparent and having a thickness of about 0.2 mm. The substrate 353 may be optically opaque and/or comprise polyimide.

Mounted on a first major surface 353a of the substrate 353 is a first coil 355 having first and second input terminals. Also mounted on the first major surface 353a is a second coil 357 having first and second output terminals.

Each of the first and second coils 355, 357 are substantially circular and have an axis of symmetry. Other configuration of first and second coils may be used, for example rectangular coils.

The axes of symmetry of the first and second coils are aligned and lie along the line P-P'. With reference to FIGS. 20 and 21, the metal portion is aligned with the line P-P' and slidable in a parallel relationship thereto.

First and second electrical contacts 351a, 351b are disposed on the first major surface 353a of the substrate 353. The first electrical contact 351a is in electrical communication with the first input terminal of the first coil 355 via electrically conductive track 351c. The second electrical contact 351b is in electrical communication with the second input terminal of the first coil 355 via electrically conductive track 351d.

The first and second electrical contacts 351a, 351b may be used to provide electrical power to the first coil 355 such that upon connecting the first and second electrical contacts to a suitable alternating current power supply, an alternating magnetic field is produced by the first coil 355.

Also disposed on the first major surface 353a of the substrate 353 are third and fourth electrical contacts 352a, 352b.

The third electrical contact 352a is in electrical communication with the first output terminal of the second coil 357 via electrically conductive track 352c. The fourth electrical contact 352b is in electrical communication with the second output terminal of the second coil 357 via electrically conductive track 352d. The third and fourth electrical contacts 162a, 162b are also disposed on the first major surface 163a in the same manner as the first and second electrical contacts 161a, 161b.

The second coil 357 may be used to detect a magnetic field induced in the metal portion 267.

The electrically conductive tracks 351c, 351d and 352c, 352d may be screen printed onto the first major surface 353a of the substrate 353.

A region 359 of the sensor assembly is indicated and this region 359 is arranged to be outside of the periphery of the laminated glazing into which said sensor assembly 350 will be incorporated, as shown in FIGS. 20 and 21.

FIG. 23 shows a schematic cross-sectional representation of another switching device 411 in accordance with the present invention. The switching device 411 comprises a first sheet of glass 413 joined to a second sheet of glass 415 by means of two plies of polyvinyl butyral (PVB) 417, 419. Positioned between the first and second plies of PVB 417, 419 is a portion of a sensor assembly 460 comprising a substrate 463. Mounted on the substrate 463 is a capacitive sensor 465 comprising first and second capacitor plates.

In this example the substrate 463 is a sheet of polyethylene terephthalate (PET). Electrically conductive pathways on the PET sheet 463 are used to provide power to the capacitive sensor 465. A portion 469 of the sensor assembly 460 extends beyond the periphery of the sheets of PVB 417, 419.

Attached to the major surface 413a of the first glass sheet 413 is a switch 423 comprising a rubber button 424. The rubber button 424 may be made of other resilient material. The rubber button 424 is attached to the major surface 413a by means of a suitable adhesive.

The rubber button 424 is hollow and defines a space 425 between the major surface 413a and the inner surface of the rubber button 424 i.e. the surface of the rubber button facing the space 425. Located on the inner surface of the rubber button 424 facing the major surface 413a is an electrically conductive layer 426, such as an electrically conductive element 426 being an electrically conductive coating, metal foil or metallic mesh or the like. The electrically conductive element is a capacitor plate operatively coupled with the first and second capacitor plates that are part of the capacitive sensor 465. A first capacitance is formed between the first capacitor plate of the capacitive sensor 465 and the electrically conductive layer 426. A second capacitance is formed between the second capacitor plate of the capacitive sensor 465 and the electrically conductive layer 426.

As shown in FIG. 24, when the rubber button 424 is pressed by finger 39 in the direction of arrow 438 i.e. towards the major surface 413a, the electrically conductive layer 426 moves towards the major surface 413a causing a change in capacitance between the first and second capacitor plates of that capacitive sensor is measurable by a microcontroller (which may also be included on the substrate 463).

An electromagnetic shield 421 (shown in phantom), for example an electrically conductive plate, may optionally be attached to the major surface 415a of the second sheet of glass 415. The electromagnetic shield 421 prevents the capacitive sensor 465 from detecting capacitance changes in the direction of the major surface 415a.

In FIG. 23 the rubber button 424 is shown in a first position and in FIG. 24 the rubber button 424 is shown in a second position.

Figure 25:
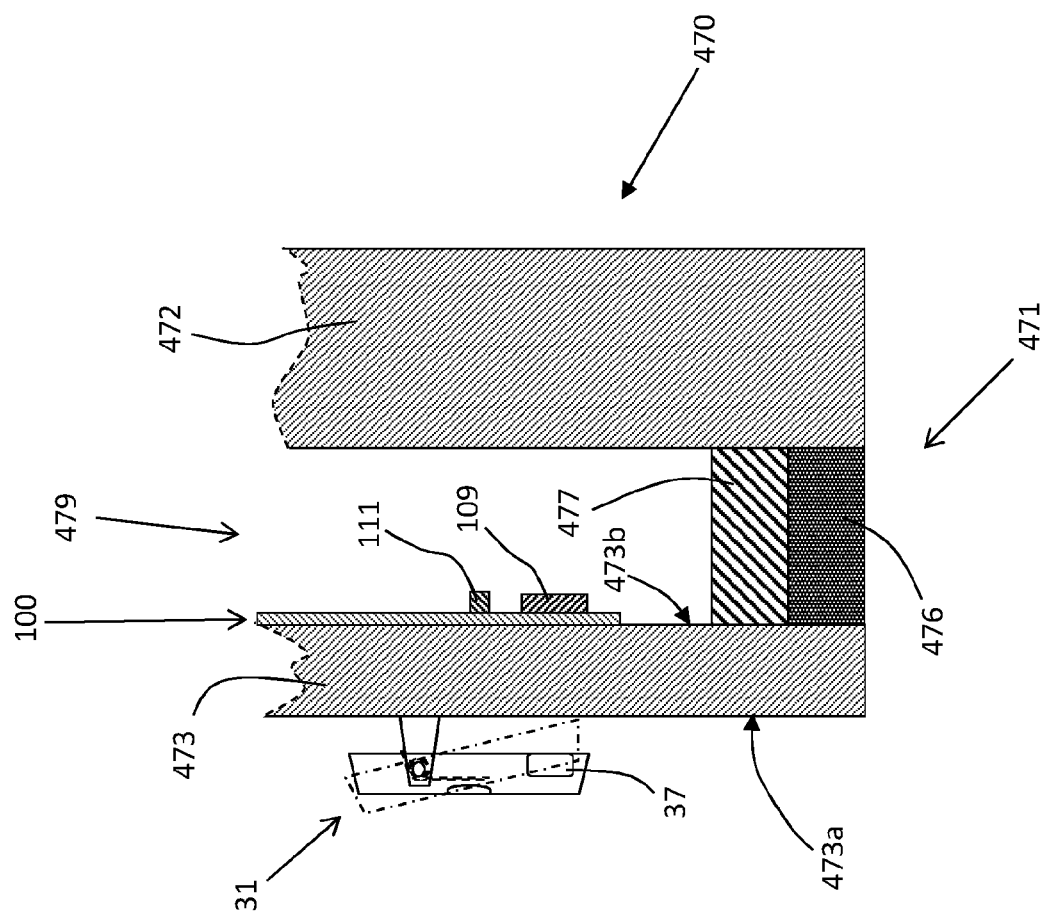
FIG. 25 shows a schematic cross-sectional representation of another switchable device in accordance with the present invention.

FIG. 25 shows a schematic cross-sectional view of another switching device 470 in accordance with the present invention. In this embodiment, the switching device 470 comprises an insulated glazing unit 471.

The insulated glazing unit 471 comprises a first sheet of glass 472 spaced apart from a second sheet of glass 473 by a perimeter seal 476 and spacer bar 477. The first sheet of glass 472 is joined to the second sheet of glass 473 by at least the perimeter seal 476.

Between the first and second sheets of glass 472, 473 is an air space 479, which may be a lower pressure space.

The second sheet of glass 473 has a first major surface 473a and an opposing second major surface 473b. Attached to the first major surface 473a of the second sheet of glass 473 is a switch 31 as previously described with reference to FIGS. 9 and 10. Attached to the second major surface 473b of the second sheet of glass 473 is a sensor assembly 100 as described with reference to FIGS. 3 and 4.

The Hall effect sensor 109 is operatively coupled with the permanent magnet 37 that is part of the switch 31. The LED 111 is able to illuminate the switch 31 as previously described. The switch 31 in a "pressed" state is shown in phantom i.e. in the configuration shown in FIG. 10.

In the previously described examples, the respective sensor assembly may be susceptible to stray signals from the movement of parts other than the movable portion of the switch. To reduce the sensitivity of the sensor assembly to such stray signals, means may be included to reduce the intensity of the stray signals that may be detectable by the sensor assembly. For example, for a sensor assembly comprising an optical sensor, the use of black paint around the optical sensor may be used to reduce the sensitivity of the optical sensor to stray optical signals. Similarly, when the movable portion of the switch is operatively coupled to the sensor assembly by a magnetic field, other potentially movable parts other than the movable portion of the switch may be made of a material that does not have an effect on the magnetic coupling.

Figure 26:
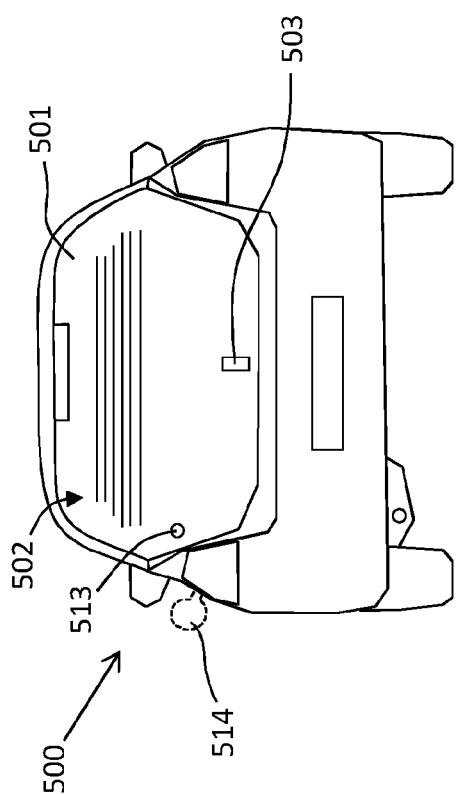
FIG. 26 shows a schematic representation of a car viewed from behind, the car incorporating a rear window being a switchable device according to the present invention.
Figure 27:
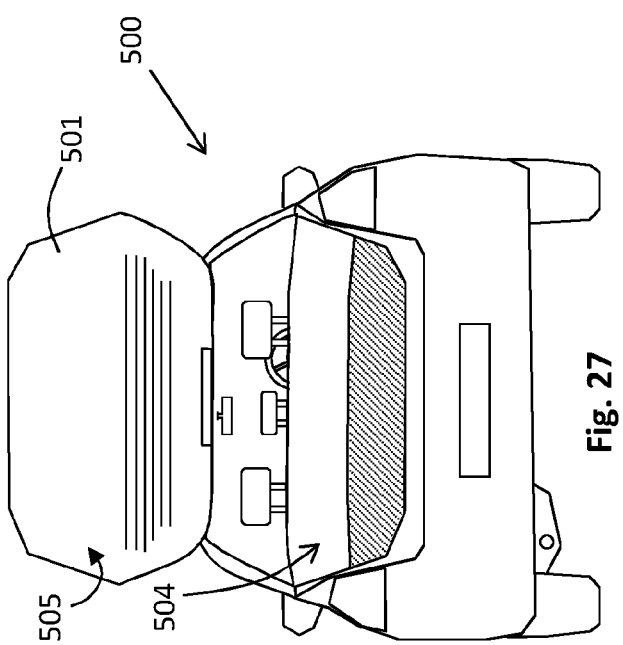
FIG. 27 shows a schematic representation of the car shown in FIG. 26 where the rear window is open and optionally the fuel filler cap is open.

FIGS. 26 and 27 show a schematic view towards the rear of a car 500. The car 500 comprises a rear window 501, often referred to as a "backlight". The rear window 501 comprises a sheet of glazing material, such as soda-lime-silica glass and may be monolithic or laminated. In FIG. 26 the rear window 501 is in a closed position such that the boot of the car is not accessible.

The rear window 501 is a switching device according to the present.

Attached to the outer facing surface 502 of the rear window 501 is a first switch 503 comprising a movable portion and is of the type of switch previously described. Upon operating the switch 503 the rear window 501 is caused to move to an open position as shown in FIG. 27 by actuation of a suitable motorised mechanism (not shown). When the rear window is in the open position shown in FIG. 27, the interior 504 of the car 500 is accessible, as is the inner facing surface 505 of the rear window 501. By having the switch 503 attached to the glazing material of the rear window, the switch may be conveniently located for operation by a user. This is particularly useful for rear windows that are not incorporated in a metal frame.

Also positioned on the rear window 501 is a second switch 513 comprising a movable portion and is of the type of switch previously described. The second switch 513 may be instead of, or as well as, the switch 503.

Upon operating the second switch 513 the fuel filler cap 514 is opened (shown in phantom in the open position in FIG. 26) allowing access to the fuel tank.

In an alternative embodiment, the second switch 513 is positioned on a side window of the car.

The present invention finds particular application in automotive and architectural applications where the switching device may be part of an automotive glazing or an architectural glazing. The glazing may be part of a window or door and, using common naming convention, the switch may be attached to "surface one" of the glazing. By having a manually operable switch on the glazing, the location thereof can be positioned to allow more convenient operation of the switch.

The invention claimed is:

1. A switching device comprising a first sheet of glazing material having a first major surface and an opposing second major surface, a second sheet of glazing material spaced apart from the first sheet of glazing material, a switch attached to the first major surface of the first sheet of glazing material, and a sensor assembly between the first and second sheets of glazing material and facing the second major surface of the first sheet of glazing material, wherein the switch comprises a movable portion operatively coupled with the sensor assembly such that upon operation of the switch, the movable portion moves from a first position to a second position and the movement of the movable portion from the first position to the second position is detectable by the sensor assembly.

2. The switching device according to claim 1, wherein the sensor assembly comprises a sensor and a substrate, the substrate having a first major surface and a second opposing major surface, wherein the sensor is configured to detect the movement of the movable portion from the first position to the second position.

3. The switching device according to claim 2, wherein the sensor is mounted on the first or second major surface of the substrate and/or wherein the first major surface of the substrate faces the second major surface of the first sheet of glazing material.

4. The switching device according to claim 2, wherein the sensor is mounted on the first major surface of the substrate and the first major surface of the substrate faces the second major surface of the first sheet of glazing material or wherein the sensor is mounted on the second major surface of the substrate and the first major surface of the substrate faces the second major surface of the first sheet of glazing material.

5. The switching device according to claim 2, further comprising a second sheet of glazing material, wherein the substrate is between a first sheet of adhesive interlayer material and a second sheet of adhesive interlayer material and the first and second sheets of adhesive interlayer material are between the first and second sheets of glazing material.

6. The switching device according to claim 1, wherein the sensor assembly comprises a sensor mounted on the second major surface of the first sheet of glazing material, the sensor being configured to detect a perturbation in the coupling between the movable portion and the sensor assembly due to the movement of the movable portion from the first position to the second position.

7. The switching device according to claim 1, wherein the sensor comprises a sensing portion and the sensing portion faces the second major surface of the first sheet of glazing material.

8. The switching device according to claim 1, wherein the sensor assembly functions as a proximity sensor to detect the movement of the movable portion of the switch from the first position to the second position.

9. The switching device according to claim 1, wherein the movable portion is operatively coupled to the sensor assembly by an electric field.

10. The switching device according to claim 1, wherein the movable portion is operatively coupled to the sensor assembly by a magnetic field.

11. The switching device according to claim 10, wherein the movable portion comprises a magnetically permeable element movable from a first position to a second position and the sensor assembly comprises a magnet and a magnetic field sensor; or wherein the sensor assembly comprises an inductive sensor; or wherein the movable portion comprises a magnetically permeable element and the sensor assembly comprises an inductive sensor; or wherein the movable portion comprises an electrically conductive loop or closed-circuit coil and the sensor assembly comprises an inductive sensor; or wherein the movable portion comprises at least one closed circuit coil and the sensor assembly comprises a first coil, the first coil of the sensor assembly having first and second electrical connectors such that upon moving the movable portion from the first position to the second position the inductive coupling between the at least one closed circuit coil of the movable portion and the first coil of the sensor assembly is measurable between first and second electrical contacts of the first coil of the sensor assembly; or wherein the movable portion comprises at least one closed circuit coil and the sensor assembly comprises first and second coils, the first coil of the sensor assembly having first and second electrical connectors and the second coil of the sensor assembly being in electrical communication with an alternating current power supply for producing an alternating magnetic field in the second coil of the sensor assembly, wherein upon moving the movable portion from the first position to the second position the inductive coupling between the at least one closed circuit coil of the movable portion, the first coil of the sensor assembly and the second coil of the sensor assembly is measurable between first and second electrical contacts of the first coil of the sensor assembly.

12. The switching device according to claim 1, wherein the movable portion is operatively coupled with the sensor assembly by at least one acoustic signal, the at least one acoustic signal being produced by moving the movable portion from the first position to the second position, the acoustic signal being detectable by the sensor assembly.

13. The switching device according to claim 1, wherein the movable portion is operatively coupled with the sensor assembly by at least a first beam of electromagnetic radiation, wherein the first beam of electromagnetic radiation is transmitted through the first sheet of glazing material and moving the movable portion from the first position to the second position causes a disturbance of the first beam of electromagnetic radiation.

14. The switching device according to claim 13, wherein the sensor assembly comprises (i) a transmitter portion for emitting the first beam of electromagnetic radiation through the first sheet of glazing material towards the movable portion, and (ii) a sensor portion for detecting electromagnetic radiation, and the movable portion comprises a portion reflective to electromagnetic radiation emitted by the transmitter portion, such that upon moving the movable portion from the first position to the second position, electromagnetic radiation from the first beam of electromagnetic radiation is reflected onto the sensor portion.

15. The switching device according to claim 13, wherein the sensor assembly comprises (i) a transmitter portion for emitting the first beam of electromagnetic radiation through the first sheet of glazing material towards the movable portion, and (ii) a sensor portion for detecting electromagnetic radiation, and the movable portion comprises a portion reflective to electromagnetic radiation emitted by the transmitter portion, the reflective portion reflecting the first beam of electromagnetic radiation onto the sensor portion, and upon moving the movable portion from the first position to the second position, electromagnetic radiation reflected off the reflective portion changes polarisation and/or amplitude and/or direction; or wherein the sensor assembly comprises (i) a transmitter portion for emitting the first beam of electromagnetic radiation towards the movable portion and a sensor portion for detecting electromagnetic radiation, the first beam of electromagnetic radiation internally reflecting off a first portion of the first major surface of the first sheet of glazing material onto to the sensor portion, and the movable portion comprises a contact portion for contacting the first portion of the first major surface of the first sheet of glazing material, such that upon moving the movable portion from the first position to the second position, the contact portion of the movable portion contacts at least the first portion of the first major surface of the first sheet of glazing material so that electromagnetic radiation from the first beam of electromagnetic radiation is prevented from reaching the sensor portion.

16. The switching device according to claim 1, wherein the movable portion of the switch is caused to move between the first position and the second position by a manually generated force and/or wherein the movable portion of the switch is caused to move between the first position and the second position by a manually generated force parallel to or perpendicular to the first major surface; or wherein the movable portion of the switch is slidable or rotatable relative to the first major surface of the first sheet of glazing material; or wherein the movable portion of the switch is a depressible portion.

17. A window or door comprising at least one switching device according to claim 1, the window or door being part of a vehicle having an interior or a building having an interior, wherein the first major surface of the first sheet of glazing material faces away from the interior of the vehicle or the interior of the building.

18. A vehicle having a window according to claim 17, wherein the switching device is operatively coupled with an electrically operable device, the electrically operable device at least in part controlling the operational state of one or more of a vehicle window, a vehicle door, a vehicle rear window, a vehicle bonnet, a vehicle boot lid and a vehicle fuel filler cap.

19. The switching device according to claim 1, wherein the sensor assembly comprises a capacitance sensor and movement of the movable portion causes a change in capacitance that is detectable by the sensor assembly.

* * * * *